US011737364B2

(12) United States Patent
Adachi et al.

(10) Patent No.: US 11,737,364 B2
(45) Date of Patent: Aug. 22, 2023

(54) THERMOELECTRIC CONVERSION MATERIAL, THERMOELECTRIC CONVERSION ELEMENT, THERMOELECTRIC CONVERSION MODULE, AND OPTICAL SENSOR

(71) Applicants: SUMITOMO ELECTRIC INDUSTRIES, LTD., Osaka (JP); TOYOTA SCHOOL FOUNDATION, Nagoya (JP)

(72) Inventors: Masahiro Adachi, Osaka (JP); Kotaro Hirose, Osaka (JP); Makoto Kiyama, Osaka (JP); Takashi Matsuura, Osaka (JP); Yoshiyuki Yamamoto, Osaka (JP); Tsunehiro Takeuchi, Nagoya (JP); Shunsuke Nishino, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 202 days.

(21) Appl. No.: 16/981,586

(22) PCT Filed: Dec. 28, 2018

(86) PCT No.: PCT/JP2018/048440
§ 371 (c)(1),
(2) Date: Sep. 16, 2020

(87) PCT Pub. No.: WO2019/181142
PCT Pub. Date: Sep. 26, 2019

(65) Prior Publication Data
US 2021/0091289 A1 Mar. 25, 2021

(30) Foreign Application Priority Data

Mar. 20, 2018 (JP) .................................. 2018-053183
Sep. 3, 2018 (WO) .................. PCT/JP2018/032583

(51) Int. Cl.
*H01L 35/16* (2006.01)
*H10N 10/852* (2023.01)
(Continued)

(52) U.S. Cl.
CPC ........... *H10N 10/852* (2023.02); *C01B 19/04* (2013.01); *G01J 5/12* (2013.01); *H10N 10/857* (2023.02)

(58) Field of Classification Search
CPC ......... H01L 35/12; H01L 35/14; H01L 35/22; H01L 35/32; H01L 35/00–34; H01L 27/16; H10N 10/00–857
(Continued)

(56) References Cited

U.S. PATENT DOCUMENTS

2007/0095383 A1* 5/2007 Tajima .................... H01L 35/34
136/238
2011/0037342 A1 2/2011 Degen et al.
(Continued)

FOREIGN PATENT DOCUMENTS

JP     H08-56020 A    2/1996
JP     2007-42963 A   2/2007
(Continued)

OTHER PUBLICATIONS

Takiguchi et al., Nano Structural and Thermoelectric Properties of SiGeAu Thin Films (Year: 2011).*
(Continued)

*Primary Examiner* — Bach T Dinh
(74) *Attorney, Agent, or Firm* — Oliff PLC

(57) ABSTRACT

A thermoelectric conversion material includes: a base material that is a semiconductor composed of a base material element; a first additional element that is an element different from the base material element, has a vacant orbital in a d orbital or f orbital located internal to an outermost shell of
(Continued)

DENSITY OF STATES the first additional element and forms a first additional level in a forbidden band of the base material; and a second additional element that is an element different from both of the base material element and the first additional element and forms a second additional level in the forbidden band of the base material. A difference is 1 between the number of electrons in an outermost shell of the second additional element and the number of electrons in at least one outermost shell of the base material element.

14 Claims, 11 Drawing Sheets

(51) Int. Cl.
  *C01B 19/04* (2006.01)
  *G01J 5/12* (2006.01)
  *H10N 10/857* (2023.01)
(58) Field of Classification Search
  USPC .................................................. 136/200–242
  See application file for complete search history.

(56) References Cited

U.S. PATENT DOCUMENTS

| | | |
|---|---|---|
| 2013/0015413 A1 | 1/2013 | Park et al. |
| 2016/0126440 A1 | 5/2016 | Adachi et al. |
| 2016/0300994 A1* | 10/2016 | Adachi .................. H01L 35/22 |
| 2018/0190891 A1* | 7/2018 | Adachi ..................... G01J 5/12 |
| 2019/0214538 A1 | 7/2019 | Adachi et al. |

FOREIGN PATENT DOCUMENTS

| | | | |
|---|---|---|---|
| JP | 2008-160077 A | | 7/2008 |
| JP | 2011-520252 A | | 7/2011 |
| JP | 2014-524874 A | | 9/2014 |
| JP | WO2017002514 | * | 1/2017 |
| WO | 2014/196475 A1 | | 12/2014 |
| WO | 2017/002514 A1 | | 1/2017 |
| WO | 2018/043478 A1 | | 3/2018 |

OTHER PUBLICATIONS

Ghodke et al.; "Enhanced Thermoelectric Properties of W- and Fe-Substituted MnSig;" Jounral of Electronic Materials; 2016; pp. 5279-5284; vol. 45, No. 10.

Takiguchi et al.; "Nano Structural and Thermoelectric Properties of SiGeAu Thin Films;" Japanese Journal of Applied Physics; 2011; pp. 041301-1-041301-5; vol. 50.

Matoba et al.; "Crystallinity and Thermoelectric Properties of Si/GeB Multilayers Prepared with Si Buffer Layer and SiO2 Substrates;" Japanese Journal of Applied Physics; 2009; pp. 061201-1-061201-4; vol. 48.

Shi et al.; "Cu—Se Bond Network and Thermoelectric Compounds with Complex Diamondlike Structure;" Chem. Mater. 2010; pp. 6029-6031; vol. 22.

Sevik et al.; "Investigation of thermoelectric properties of chalcogenide semiconductors from first principles;" Journal of Applied Physics; 2011; pp. 123712-1-123712-5; vol. 109.

Ghodke et al.; "Enhanced Thermoelectric Properties of W- and Fe-Substituted MnSig;" Journal of Electronic Materials; 2010; pp. 5279-5284; vol. 46, No. 10.

* cited by examiner

THERMOELECTRIC CONVERSION MATERIAL, THERMOELECTRIC CONVERSION ELEMENT, THERMOELECTRIC CONVERSION MODULE, AND OPTICAL SENSOR

TECHNICAL FIELD

The present disclosure relates to a thermoelectric conversion material, a thermoelectric conversion element, a thermoelectric conversion module, and an optical sensor.

The present application claims a priority based on each of Japanese Patent Application No. 2018-53183 filed on Mar. 20, 2018 and International Patent Application No. PCT/JP2018/032583 filed on Sep. 3, 2018, the entire contents of which are incorporated herein by reference.

BACKGROUND ART

For a thermoelectric conversion material, there has been reported a technique in which Si, Ge, and Au are layered and the obtained layered body is then heated to form Au nano particles in SiGe (silicon germanium) (for example, Non-Patent Literature 1). There has been reported a technique in which Si/GeB is used for a thermoelectric conversion material (for example, Non-Patent Literature 2).

Patent Literature 1 discloses a thermoelectric conversion material including nano particles in a base material constituted of a semiconductor material composed of a base material element. Each of the nano particles includes the base material element and a heterogeneous element different from the base material element.

CITATION LIST

Patent Literature

PTL 1: WO 2014/196475

Non Patent Literature

NPL 1: Hiroaki Takiguchi et al., "Nano Structural and Thermoelectric Properties of SiGeAu Thin Films", Japanese Journal of Applied Physics 50 (2011) 041301

NPL 2: Akinari Matoba et al., "Crystallinity and Thermoelectric Properties of Si/GeB Multilayers Prepared with Si Buffer Layer and SiO2 Substrates", Japanese Journal of Applied Physics 48 (2009) 061201

SUMMARY OF INVENTION

A thermoelectric conversion material according to the present disclosure includes: a base material that is a semiconductor composed of a base material element; a first additional element, the first additional element being an element different from the base material element, the first additional element having a vacant orbital in a d orbital or f orbital located internal to an outermost shell of the first additional element, the first additional element forming a first additional level in a forbidden band of the base material; and a second additional element, the second additional element being an element different from both of the base material element and the first additional element, the second additional element forming a second additional level in the forbidden band of the base material. A difference is 1 between the number of electrons in an outermost shell of the second additional element and the number of electrons in at least one outermost shell of the base material element.

DETAILED DESCRIPTION

Figure 1:
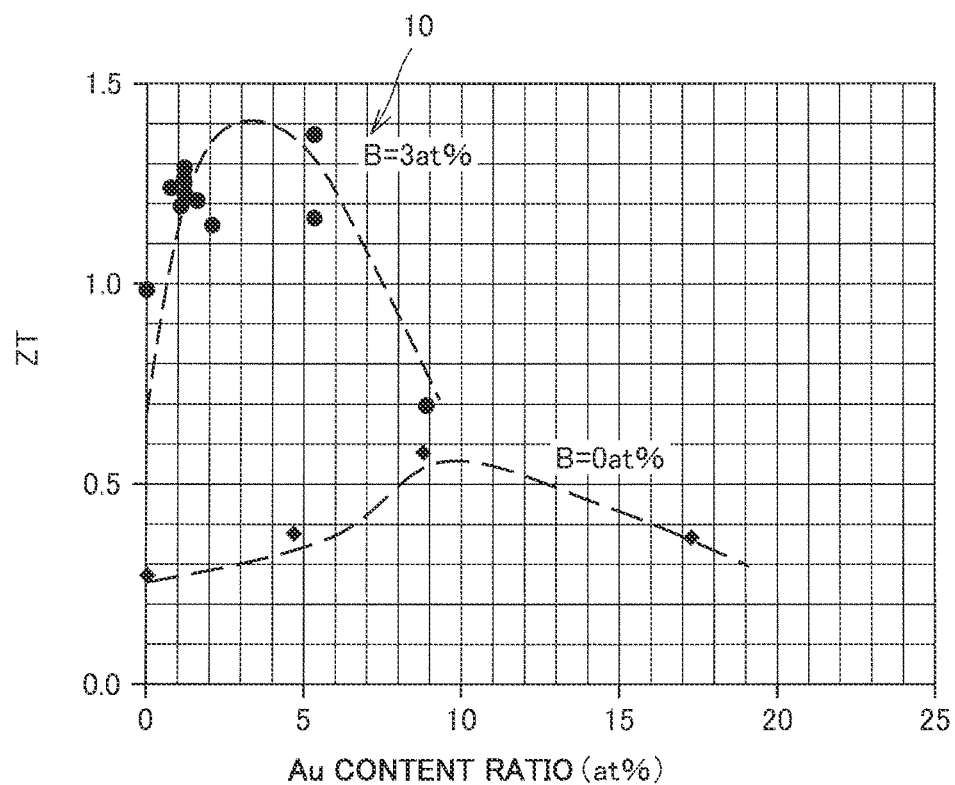
FIG. 1 is a graph showing a relation between a value of ZT and a content ratio of Au.

In recent years, renewable energy has been drawing attention as clean energy to replace a fossil fuel such as petroleum. Such renewable energy include: energy obtained through power generation using solar light, hydraulic power, and wind power; and energy obtained through power generation by thermoelectric conversion using a temperature difference. In the thermoelectric conversion, heat is directly converted into electric power. Hence, an unnecessary waste is not discharged during the conversion. Because the thermoelectric conversion requires no driving unit such as a motor, the thermoelectric conversion has a characteristic to facilitate maintenance of devices.

Efficiency η in converting a temperature difference (heat energy) into electric energy using a material (thermoelectric conversion material) for thermoelectric conversion is given by the following formula (1):

$$\eta = \Delta T/T_h \cdot (M-1)/(M+T_c/T_h) \quad (1)$$

where η represents conversion efficiency, ΔT represents a difference between $T_h$ and $T_c$, $T_h$ represents a temperature on the high temperature side, $T_c$ represents a temperature on the low temperature side, M equals to $(1+ZT)^{1/2}$, $ZT=\alpha^2 ST/\kappa$, ZT represents a dimensionless figure of merit, α represents a Seebeck coefficient, S represents an electric conductivity, and κ represents a thermal conductivity. The conversion efficiency is a monotonously increasing function of ZT. It is important to increase ZT in developing a thermoelectric conversion material.

[Problem to be Solved by the Present Disclosure]

A thermoelectric conversion material has been required which has higher conversion efficiency than those in the thermoelectric conversion materials disclosed in Non-Patent Literature 1, Non-Patent Literature 2, and Patent Literature 1. When ZT can be increased, the efficiency of thermoelectric conversion can be improved.

Hence, it is one of objects to provide a thermoelectric conversion material, a thermoelectric conversion element, a thermoelectric conversion module, and an optical sensor, in each of which efficiency of thermoelectric conversion is improved.

[Advantageous Effect of the Present Disclosure]

According to the above-described thermoelectric conversion material, the efficiency of thermoelectric conversion can be improved.

DESCRIPTION OF EMBODIMENTS

First, embodiments of the present application are listed and described. A thermoelectric conversion material according to the present application includes: a base material that is a semiconductor composed of a base material element; a first additional element, the first additional element being an element different from the base material element, the first additional element having a vacant orbital in a d orbital or f orbital located internal to an outermost shell of the first additional element, the first additional element forming a first additional level in a forbidden band of the base material; and a second additional element, the second additional element being an element different from both of the base material element and the first additional element, the second additional element forming a second additional level in the forbidden band of the base material. A difference is 1 between the number of electrons in an outermost shell of the second additional element and the number of electrons in at least one outermost shell of the base material element.

The thermoelectric conversion material includes the base material that is the semiconductor composed of the base material element. Since the band gap of the semiconductor is larger than that of an electrically conductive material, a Seebeck coefficient can be large. As a result, dimensionless figure of merit ZT can be large by employing the base material.

Since the first additional element is included, the thermoelectric conversion material can form the first additional level as a new level in the forbidden band of the base material. Since the first additional element has the vacant orbital in the d orbital or f orbital located internal to the outermost shell of the first additional element, the energy width of the first additional level can be small. Therefore, even though the Seebeck coefficient is high, electric conductivity can be increased. The thermoelectric conversion material includes the second additional element, the second additional element being an element different from both of the base material element and the first additional element, the second additional element forming the second additional level in the forbidden band of the base material. The difference is 1 between the number of electrons in the outermost shell of the second additional element and the number of electrons in the outermost shell of the base material element. Therefore, a Fermi level can be controlled by forming an acceptor level or donor level by the second additional level formed by the second additional element. As a result, the efficiency of thermoelectric conversion can be improved by increasing ZT more securely.

In the thermoelectric conversion material, a crystal phase having a grain size of less than or equal to 50 nm and composed of the base material element may be included in a structure of the thermoelectric conversion material. Since the electric conductivity of the crystal phase is higher than that of an amorphous phase, ZT is increased. On the other hand, when the grain size of the crystal phase becomes too large, thermal conductivity tends to be high. With the grain size of the crystal phase composed of the base material element being less than or equal to 50 nm, the thermal conductivity can be suppressed from being increased. Therefore, according to such a thermoelectric conversion material, the thermal conductivity can be suppressed from being increased, while improving the electric conductivity. Therefore, the efficiency of thermoelectric conversion can be improved more by increasing ZT. The grain size may be less than or equal to 25 nm. In this case, the thermal conductivity can be further suppressed from being increased. Moreover, when the grain size is 20 nm, the thermal conductivity can be further suppressed from being increased.

A ratio of an intensity of a peak having a maximum intensity in peaks each indicating a crystal phase including at least one of the first additional element and the second additional element, to an intensity of a peak having a maximum intensity in peaks each indicating a crystal phase composed of the base material element may be less than or equal to 2.0% in an X-ray diffraction pattern of the thermoelectric conversion material. When a multiplicity of crystal phases each including at least one of the first additional element and the second additional element are precipitated in the thermoelectric conversion material, a carrier concentration is decreased to result in deviation of the position of the Fermi level or the density of the first additional level is decreased as compared with the case where the number of crystal phases is small. Due to at least one or both of these factors, the effect of formation of the first additional level and the effect of formation of the second additional level are less likely to be obtained sufficiently. According to the above-described thermoelectric conversion material, since the amount of precipitation of the first additional element as the crystal phase and the amount of precipitation of the second additional element as the crystal phase are small, the effect of formation of the first additional level by the first additional element and the effect of formation of the second additional level by the second additional element can be obtained more securely. Therefore, the efficiency of thermoelectric conversion can be more improved. It should be noted that the above-described ratio of the intensity is preferably less than or equal to 1.0%, is more preferably less than or equal to 0.5%, and is further preferably 0.0%.

In the thermoelectric conversion material, a content ratio of a crystal phase including at least one of the first additional element and the second additional element to a whole of a structure of the thermoelectric conversion material may be less than or equal to 6.0 volume %. In such a thermoelectric conversion material, since an amount of precipitation of the first additional element as the crystal phase and an amount of precipitation of the second additional element as the crystal phase are small, the effect of formation of the first additional level by the first additional element and the effect of formation of the second additional level by the second additional element can be obtained more securely. Therefore, the efficiency of thermoelectric conversion can be more improved.

In the thermoelectric conversion material, the structure of the thermoelectric conversion material may include an amorphous phase including the base material element as a main component. A crystal phase composed of the base material element may exist in the amorphous phase. The thermoelectric conversion material including the amorphous phase can have a low thermal conductivity. Therefore, ZT can be increased. Moreover, since the crystal phase composed of the base material element exists in the amorphous phase, the electric conductivity of the thermoelectric conversion material can be improved. Therefore, ZT can be increased. Therefore, the efficiency of thermoelectric conversion can be more improved.

In the thermoelectric conversion material, the first additional element may be a transition metal. This facilitates formation of the first additional level having a small energy width. Therefore, the electric conductivity can be increased. As a result, the efficiency of thermoelectric conversion can be improved by increasing ZT.

In the thermoelectric conversion material, the second additional level may exist between the first additional level and an energy band that is one of a valence band and a conduction band each adjacent to the forbidden band of the base material, the one of the valence band and the conduction band being close to the first additional level relative to the other of the valence band and the conduction band. With the second additional level, the Fermi level of the base material can be close to the energy band that is the one of the valence band and the conduction band, the one of the valence band and the conduction band being close to the first additional level relative to the other of the valence band and the conduction band. As a result, the efficiency of thermoelectric conversion can be improved by increasing ZT.

In the thermoelectric conversion material, a density of states of the first additional level may have a ratio of more than or equal to 0.1 with respect to a maximum value of a density of states in a valence band adjacent to the forbidden band of the base material. In this way, the density of states of the first additional level can be comparatively larger than the density of states of the valence band. Therefore, the electric conductivity can be increased. As a result, the efficiency of thermoelectric conversion can be improved by increasing ZT.

In the thermoelectric conversion material, a content ratio of the first additional element may be more than or equal to 0.1 at % and less than or equal to 5 at %. This facilitates formation of the first additional level having a small energy width. Therefore, the electric conductivity can be increased. As a result, the efficiency of thermoelectric conversion can be improved by increasing ZT.

In the thermoelectric conversion material, the base material may be a SiGe-based material. A ratio of an energy difference between a valence band of the base material and the first additional level at a position closest to the valence band of the base material to a band gap of the base material may be more than or equal to 20%. A ratio of an energy difference between a conduction band of the base material and the first additional level at a position closest to the conduction band of the base material to the band gap of the base material may be more than or equal to 20%. Since such a first additional element is included, the first additional level can be securely formed as a new level in the forbidden band when the base material is the SiGe-based material. The SiGe-based material refers to: SiGe; and a material in which another element such as C or Sn substitutes for a part of at least one of Si and Ge in SiGe. It should be noted that when there are a plurality of the first additional levels, the ratio of the energy difference between the valence band of the base material and the first additional level at the position closest to the valence band in the plurality of first additional levels may be more than or equal to 20%, and the ratio of the energy difference between the conduction band of the base material and the first additional level at the position closest to the conduction band in the plurality of first additional levels may be more than or equal to 20%.

In the thermoelectric conversion material, the first additional element may be Au, Fe, Cu, Ni, Mn, Cr, V, Ti, Ag, Pd, Pt, or Ir. These elements are suitably used when forming the first additional level in the forbidden band in the case where the base material is the SiGe-based material.

In the thermoelectric conversion material, the first additional element may be Au or Cu. The second additional element may be B. In this way, when the base material is the SiGe-based material, Au or Cu can be employed as the first additional element to form the first additional level as a new level in the forbidden band. Moreover, by employing B as the second additional element and by forming the acceptor level by the second additional level formed by the second additional element, the Fermi level can be controlled. As a result, the efficiency of thermoelectric conversion can be improved by increasing ZT more securely.

In the thermoelectric conversion material, the first additional element may be Fe. The second additional element may be P. In this way, when the base material is the SiGe-based material, Fe can be employed as the first additional element to form the first additional level as a new level in the forbidden band. Moreover, by employing P as the second additional element and by forming the donor level by the second additional level formed by the second additional element, the Fermi level can be controlled. As a result, the efficiency of thermoelectric conversion can be improved by increasing ZT more securely.

In the thermoelectric conversion material, the base material may be a MnSi-based material. The first additional element may be Re or W. The second additional element may be Cr or Fe. In this way, the electric conductivity can be increased more securely. As a result, the efficiency of thermoelectric conversion can be improved by increasing ZT. The MnSi-based material refers to: MnSi; and a material in which another element such as Al or W substitutes for a part of at least one of Mn and Si in MnSi.

In the thermoelectric conversion material, the base material may be a SnSe-based material. The first additional element may be Sc, Ti, or Zr. The second additional element may be F, Cl, Br, I, N, P, As, Sb, Bi, B, Al, Ga, or In. In this way, the electric conductivity can be increased more securely. As a result, the efficiency of thermoelectric conversion can be improved by increasing ZT. The SnSe-based material refers to: SnSe; and a material in which another element such as S or Te substitutes for a part of at least one of Sn and Se in SnSe.

In the thermoelectric conversion material, the base material may be a $Cu_2Se$-based material. The first additional element may be V, Sc, Ti, Co, or Ni. The second additional element may be F, Cl, Br, I, N, P, As, Sb, Bi, Mg, Zn, or Cd. In this way, the electric conductivity can be increased more securely. As a result, the efficiency of thermoelectric conversion can be improved by increasing ZT. The $Cu_2Se$-based material refers to: $Cu_2Se$; and a material in which another element such as Ag, S, or Te substitutes for a part of at least one of Cu and Se in $Cu_2Se$.

A thermoelectric conversion element according to the present application includes: a thermoelectric conversion material portion; a first electrode disposed in contact with the thermoelectric conversion material portion; and a second electrode disposed in contact with the thermoelectric conversion material portion and disposed to be separated from the first electrode. The thermoelectric conversion material portion is composed of the thermoelectric conversion material of the present application, the thermoelectric conversion material being adjusted in component composition to have p type or n type conductivity.

In the thermoelectric conversion element of the present application, the thermoelectric conversion material portion is composed of the thermoelectric conversion material that is excellent in the thermoelectric conversion characteristic and that is adjusted in component composition to have the p type or n type conductivity. Hence, according to the thermoelectric conversion element of the present application, a thermoelectric conversion element excellent in conversion efficiency can be provided.

A thermoelectric conversion module according to the present application includes a plurality of the thermoelectric conversion elements. According to the thermoelectric conversion module of the present application, since the plurality of thermoelectric conversion elements of the present application each excellent in the efficiency of thermoelectric conversion are included, there can be obtained a thermoelectric conversion module in which efficiency of thermoelectric conversion is improved.

An optical sensor according to the present application includes: an absorber that absorbs optical energy; and a thermoelectric conversion material portion connected to the absorber. The thermoelectric conversion material portion is composed of the thermoelectric conversion material of the present application, the thermoelectric conversion material being adjusted in component composition to have p type or n type conductivity.

In the optical sensor of the present application, the thermoelectric conversion material portion is composed of the thermoelectric conversion material that is excellent in the thermoelectric conversion characteristic and that is adjusted in component composition to have the p type or n type conductivity. Therefore, a high-sensitivity optical sensor can be provided.

DETAILS OF EMBODIMENTS OF THE INVENTION OF THE PRESENT APPLICATION

Next, the following describes an embodiment of a thermoelectric conversion material of the present application with reference to figures. It should be noted that in the below-described figures, the same or corresponding portions are given the same reference characters and are not described repeatedly.

First Embodiment

The following describes a configuration of a thermoelectric conversion material according to a first embodiment of the present application. The thermoelectric conversion material according to the first embodiment of the present application includes: a base material that is a semiconductor composed of a base material element; a first additional element, the first additional element being an element different from the base material element, the first additional element having a vacant orbital in a d orbital or f orbital located internal to (adjacent to) an outermost shell of the first additional element; and a second additional element, the second additional element being an element different from both of the base material element and the first additional element. A difference is 1 between the number of electrons in an outermost shell of the second additional element and the number of electrons in an outermost shell of the base material element. In the present embodiment, the base material is SiGe, which is a semiconductor, for example. Specifically, the base material element is each of Si and Ge. The first additional element is Au. The second additional element is B. The first additional level formed by Au exists in a forbidden band of SiGe. A difference is 1 between the number of electrons in an outermost shell of B and the number of electrons in outermost shells of Si and Ge, each of which is the base material element.

Au is a transition metal. The first additional level formed by Au exists in the forbidden band of SiGe. The second additional level formed by B exists between a valence band and the first additional level. The valence band is an energy band close to the first additional level relative to a conduction band, the valence band and the conduction band being adjacent to the forbidden band of SiGe.

The following briefly describes a method for manufacturing the thermoelectric conversion material according to the first embodiment of the present application. First, a sapphire substrate serving as a base substrate is prepared. Next, for example, in accordance with an MBE (Molecular Beam Epitaxy) method, the plurality of source material elements for the thermoelectric conversion material are deposited on the sapphire substrate using a vapor deposition device. On this occasion, Si is emitted at a rate of 1 nm/minute, Ge is emitted at a rate of 1 nm/minute, Au is emitted at a rate of 0.1 nm/minute, and B is emitted at a rate of 0.1 nm/minute. They are emitted simultaneously. By maintaining this state, an amorphous film having a total thickness of more than or equal to 200 nm is deposited, thus performing film formation. The obtained product is subjected to annealing treatment, specifically, heat treatment for heating to 500° C. and holding for 15 minutes. With this heat treatment, Au serving as the first additional element and B serving as the second additional element are activated. In this way, the thermoelectric conversion material according to the first embodiment is obtained.

FIG. 1 is a graph showing a relation between a content ratio of Au and a value of ZT. FIG. 1 shows a relation between the content ratio of Au and ZT when 3 at % of B is added, as well as a relation between the content ratio of Au and ZT when B is not added. In FIG. 1, the vertical axis represents the value of ZT and the horizontal axis represents the content ratio (at %) of Au. In FIG. 1, each circle mark represents a case where 3 at % of B serving as second additional element 10 is added and film formation is performed under an ambient temperature of 150 K. As a reference, in FIG. 1, each rhombus mark represents a case where 0 at % of B is added, i.e., no second additional element is added and film formation is performed under the ambient temperature of 150 K. Broken lines respectively represent an eye guide in the case where 3 at % of B is added and an eye guide in the case where no second additional element is added. A thermoelectric characteristic is measured using a thermoelectric characteristic measurement device (RZ2001i provided by OZAWA SCIENCE). The thermoelectric characteristic is measured in the following manner. First, the thermoelectric conversion material is fixed to be bridged between a pair of quartz fixtures, and an atmosphere is heated using a resistive heating furnace. One of the quartz fixtures is hollow, and nitrogen gas is permitted to flow therein for the sake of cooling, thereby cooling one end portion of the thermoelectric conversion material. Accordingly, a temperature difference is provided to the thermoelectric conversion material. In the thermoelectric conversion material, a temperature difference between two points of a surface of the thermoelectric conversion material is measured using a platinum-platinum rhodium based thermocouple (type R thermocouple). By connecting a voltmeter to the thermocouple, voltage generated due to the temperature difference between the two points is measured. Accordingly, it becomes possible to measure the generated voltage with respect to the temperature difference, whereby a Seebeck coefficient of the material can be estimated therefrom. Moreover, a resistance value is measured in accordance with a 4-terminal method. That is, two electric wires are connected on the outer side relative to two platinum wires to which the voltmeter is connected. Then, current is permitted to flow through the electric wires, and an amount of decrease of the voltage is measured using the voltmeter located on the inner side. In this way, the resistance value of the thermoelectric conversion material is measured in accordance with the 4-terminal method.

With reference to FIG. 1, the following describes the case where the content ratio of B is 0 at %, i.e., the case where no second additional element is added. As the content ratio of Au is increased from 0 at %, the value of ZT is increased gradually. ZT is about 0.6 at the maximum. The content ratio of Au on this occasion is about 10 at %. When the content ratio of Au becomes more than 10 at %, the value of ZT becomes smaller. That is, in the case where the content ratio of B is 0 at %, when the content ratio of Au is 10 at %, ZT has a maximum value of 0.6.

Figure 2:
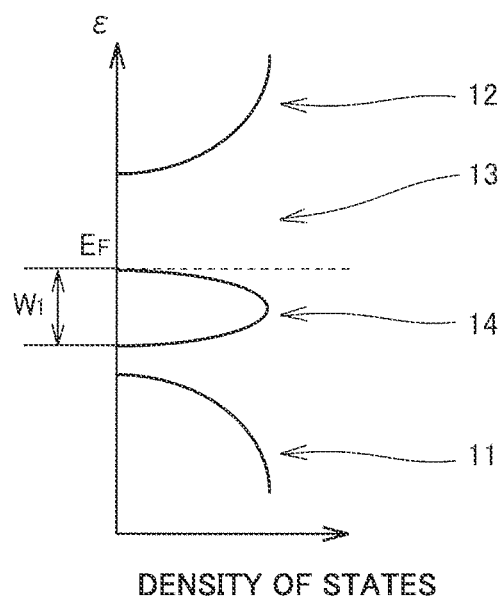
FIG. 2 is a schematic view showing an energy state of a thermoelectric conversion material when a first additional element is contained.

FIG. 2 is a schematic view showing an energy state of the thermoelectric conversion material (SiGe) when one additional element is contained. That is, FIG. 2 shows an energy state of the thermoelectric conversion material that does not contain the second additional element defined in the thermoelectric conversion material of the present application. In FIG. 2, the vertical axis represents an energy level, and the horizontal axis represents a density of states. In FIG. 2, a broken line represents a Fermi level $E_F$. In FIG. 2, Au is employed as the additional element, for example.

With reference to FIG. 2, a forbidden band 13 is formed between a valence band 11 and a conduction band 12. In forbidden band 13, there exists an additional level 14 formed by Au serving as the additional element. In a state in which the content ratio of Au is small, an energy width $W_1$ is narrow and a gap is formed between additional level 14 and Fermi level $E_F$. When the content ratio of Au is increased in order to increase ZT, additional level 14 becomes broad in the vertical axis direction, with the result that a region of additional level 14 on the conduction band 12 side becomes close to Fermi level $E_F$. As a result, energy width $W_1$ of additional level 14 become broad in the vertical axis direction, although the value of ZT is increased slightly as shown in FIG. 1. With additional level 14 having such a broad energy width $W_1$, ZT cannot be increased efficiently.

Next, the following describes the case where the content ratio of B is 3 at %. With reference to FIG. 1 again, in the case where the content ratio of B is 3 at %, when the content ratio of Au is 0.1 at %, ZT has a value of about 1.0. When the content ratio of Au is 1 at %, the value of ZT is more than 1.0. Specifically, the value of ZT is 1.2 to 1.3. When the content ratio of Au is 5.4 at %, the value of ZT may be increased to about 1.4. It should be noted that when the content ratio of Au is 8.9 at %, the value of ZT is less than 1.0. It should be noted that these compositions can be measured by a general composition analysis method. Examples thereof include an electron beam microanalyzer method, an energy dispersive X-ray spectroscopy method, and the like.

Figure 3:
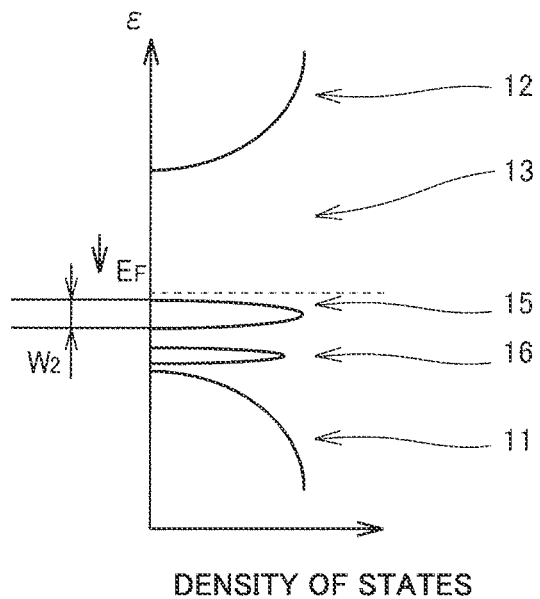
FIG. 3 is a schematic view showing an energy state of a thermoelectric conversion material according to a first embodiment.

FIG. 3 is a schematic view showing an energy state of the thermoelectric conversion material including the first additional element and the second additional element. In FIG. 3, the vertical axis represents an energy level, and the horizontal axis represents a density of states. Also in FIG. 3, a broken line represents Fermi level $E_F$.

With reference to FIG. 3, in the thermoelectric conversion material according to the first embodiment of the present application, forbidden band 13 exists between valence band 11 and conduction band 12. In this forbidden band 13, a first additional level 15 and a second additional level 16 exist. This first additional level 15 is formed by Au serving as the first additional element. Since the content ratio of Au is small, first additional level 15 in this case has an energy width $W_2$ narrower than energy width $W_1$ of additional level 14 shown in FIG. 2.

Second additional level 16 is formed by B serving as the second additional element. A difference is 1 between the number of electrons of B and the number of electrons of Si and Ge each serving as the base material element. Second additional level 16 formed by B exists between valence band 11 and first additional level 15. Valence band 11 is an energy band close to first additional level 15 relative to conduction band 12, valence band 11 and conduction band 12 being adjacent to forbidden band 13 of SiGe. In the present embodiment, an acceptor level can be formed by second additional level 16.

Since the thermoelectric conversion material according to the first embodiment includes SiGe as the base material, the Seebeck coefficient can be large. As a result, by employing SiGe as the base material, dimensionless figure of merit ZT can be large.

Since the thermoelectric conversion material according to the first embodiment includes Au as the first additional element, the first additional level can be formed as a new level. Since Au has a vacant orbital in the d orbital located internal to the P shell, energy width $W_2$ of the first additional level can be small. Therefore, even though the Seebeck coefficient is high, electric conductivity can be increased. The thermoelectric conversion material according to the first embodiment includes B serving as the element different from Si and Ge each serving as the base material element and Au serving as the first additional element, and the difference is 1 between the number of electrons in the outermost shell of B and the number of electrons in the outermost shells of Si and Ge each serving as the base material element. Therefore, the Fermi level can be controlled by forming the acceptor level by second additional level 16 formed by B. As a result, the efficiency of thermoelectric conversion can be improved by increasing ZT more securely.

In the thermoelectric conversion material according to the first embodiment, Au, which is a transition metal, is applied as the first additional element. This facilitates formation of first additional level 15 having a small energy width. Therefore, the electric conductivity can be increased. As a result, the efficiency of thermoelectric conversion can be improved by increasing ZT.

In the thermoelectric conversion material according to the first embodiment, first additional level 15 formed by Au exists in forbidden band 13 of SiGe. Second additional level 16 formed by B exists between valence band 11 and first additional level 15. Valence band 11 is an energy band close to first additional level 15 relative to conduction band 12, valence band 11 and conduction band 12 being adjacent to forbidden band 13 of SiGe. Since first additional level 15 exists in forbidden band 13, a new level can be formed by first additional level 15 in forbidden band 13. Second additional level 16 formed by B can serve to cause the Fermi level of SiGe to be close to valence band 11 that is the energy band close to first additional level 15 relative to conduction band 12. As a result, the efficiency of thermoelectric conversion can be improved by increasing ZT.

In the thermoelectric conversion material according to the first embodiment, the density of states of first additional level 15 formed by Au has a ratio of more than or equal to 0.1 with respect to the maximum value of the density of states of valence band 11 adjacent to forbidden band 13 of SiGe (see FIG. 3). In this way, the density of states of first additional level 15 can be comparatively larger than the density of states of valence band 11. Therefore, the electric conductivity can be increased. As a result, the efficiency of thermoelectric conversion can be improved by increasing ZT.

In the thermoelectric conversion material according to the first embodiment, the content ratio of Au may be more than or equal to 0.1 at % and less than or equal to 5 at %. This facilitates formation of first additional level 15 having a small energy width. Therefore, the electric conductivity can be increased. As a result, the efficiency of thermoelectric conversion can be improved by increasing ZT. It should be noted that the same applies to a thermoelectric conversion material according to a second embodiment described below, and the like.

In the above-described embodiment, the base material is the semiconductor composed of SiGe, the first additional element is Au, and the second additional element is B; however, the thermoelectric conversion material of the present application is not limited to this. For example, the base material may be a SiGe-based material. A ratio of an energy difference between the valence band of the base material and the first additional level at a position closest to the valence band of the base material to a band gap of the base material may be more than or equal to 20%. A ratio of an energy difference between a conduction band of the base material and the first additional level at a position closest to the conduction band of the base material to the band gap of the base material may be more than or equal to 20%. Since such a first additional element is included, the first additional level can be securely formed as a new level in the forbidden band when the base material is the SiGe-based material. The SiGe-based material refers to: SiGe; and a material in which another element such as C or Sn substitutes for a part of at least one of Si and Ge in SiGe.

Figure 4:
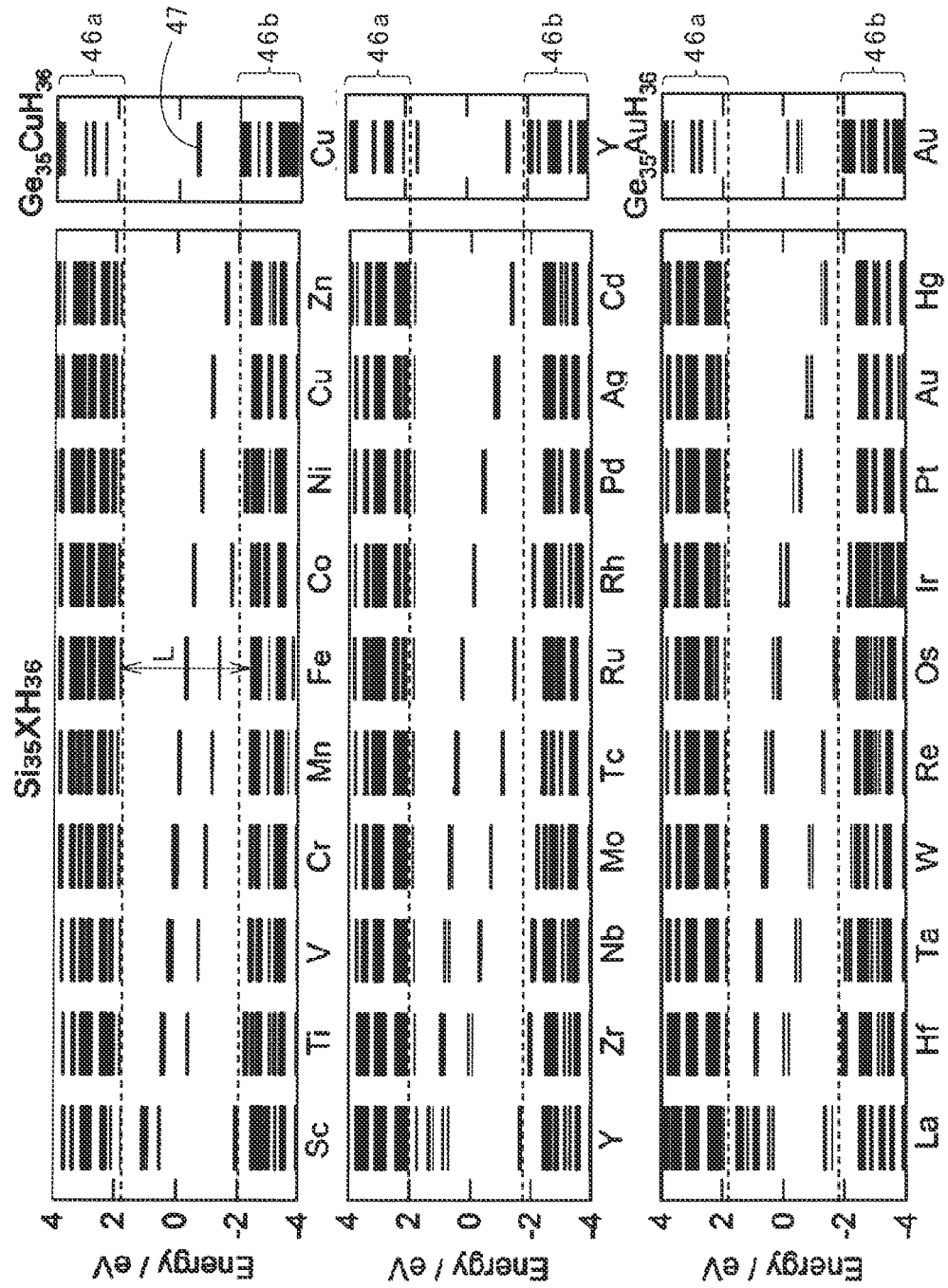
FIG. 4 shows an energy level formed by each of elements each serving as the first additional element and substituting for Si and Ge, when the base material is SiGe.

FIG. 4 shows an energy level formed by each of elements each serving as the first additional element when the base material is SiGe. In FIG. 4, a region 46a represents the conduction band and a region 46b represents the valence band. In FIG. 4, the band gap is represented by a difference L between energy of region 46a closest to region 46b and energy of region 46b closest to region 46a as indicated in the case where the first additional element is Fe. The first additional level is represented by an energy level 47 between region 46a and region 46b as indicated in the case where the element is Cu, for example. In FIG. 4, determination is made based on first-principles calculation. In FIG. 4, regarding the first additional level, the energy level may appear in the form of a single line as in the case of Cu or may appear in the form of two lines as in the case of Fe. Moreover, depending on an element, the energy level may appear in the form of three or more lines. Thus, when there are the plurality of first additional levels, the ratio of the energy difference between the valence band of the base material and the first additional level at the position closest to the valence band in the plurality of first additional levels may be more than or equal to 20%, and the ratio of the energy difference between the conduction band of the base material and the first additional level at the position closest to the conduction band in the plurality of first additional levels may be more than or equal to 20%.

With reference to FIG. 4, when SiGe is employed as the base material, for the first additional level, Au, Fe, Cu, Ni, Mn, Cr, V, Ti, Ag, Pd, Pt and Ir are exemplary elements by each of which the ratio of the energy difference between the valence band of the base material and the first additional level at the position closest to the valence band of the base material to the band gap of the base material is more than or equal to 20% and the ratio of the energy difference between the conduction band of the base material and the first additional level at the position closest to the conduction band of the base material to the band gap of the base material is more than or equal to 20%. That is, when SiGe is employed as the base material, the first additional element may be Au, Fe, Cu, Ni, Mn, Cr, V, Ti, Ag, Pd, Pt, or Ir.

Specifically, for example, the first additional element is Au or Cu and the second additional element is B. The first additional level formed by Au or Cu exists in the forbidden band of SiGe. The second additional level formed by B exists between the valence band and the first additional level. The valence band is an energy band close to the first additional level relative to the conduction band, the valence band and the conduction band being adjacent to the forbidden band of SiGe. In this way, when the base material is SiGe, Au or Cu can be employed as the first additional element to form the first additional level as a new level in the forbidden band. Moreover, by employing B as the second additional element and by forming the acceptor level by the second additional level formed by the second additional element, the Fermi level can be controlled. As a result, the efficiency of thermoelectric conversion can be improved by increasing ZT more securely.

Second Embodiment

A thermoelectric conversion material according to a second embodiment is obtained by employing Fe for the first additional element and employing P for the second additional element in the thermoelectric conversion material of the first embodiment. The first additional level formed by Fe exists in the forbidden band of SiGe. The second additional level formed by P exists between the conduction band and the first additional level. The conduction band is an energy band close to the first additional level relative to the valence band, the valence band and the conduction band being adjacent to the forbidden band of SiGe. In this way, when the base material is SiGe, Fe can be employed as the first additional element to form the first additional level as a new level in the forbidden band. Moreover, by employing P as the second additional element and by forming a donor level by the second additional level formed by the second additional element, the Fermi level can be controlled. As a result, the efficiency of thermoelectric conversion can be improved by increasing ZT more securely.

The thermoelectric conversion material according to the second embodiment can be manufactured by the following manufacturing method. First, measured Si powder, Ge powder, Fe powder, and P powder are introduced into a pot composed of stainless steel. In this case, respective content ratios of the elements are adjusted as follows: $Si_{63}Ge_{24}P_{10}Fe_3$. Moreover, forming gas is supplied into the pot to attain a reducing atmosphere. The forming gas is mixed gas of hydrogen and nitrogen with a content ratio of hydrogen therein being less than or equal to 4 volume %. Then, by way of mechanical alloying, an amorphous powder body in which the Fe and P powders are added to SiGe is obtained. That is, the mechanical alloying is performed in the mixed gas of hydrogen and nitrogen with the content ratio of hydrogen therein being less than or equal to 4 volume %. In this way, by performing the mechanical alloying in the reducing atmosphere, an amorphous semiconductor material powder body is obtained.

Next, the obtained powder body is supplied to a die with a glove box having a nitrogen gas atmosphere therein, and a sintered material is formed by a spark plasma sintering method. A temperature on this occasion can be 600° C., for example. In this way, a thermoelectric conversion material is manufactured which is composed of the sintered material in which a crystal phase of the base material element, i.e., a crystal phase of SiGe in the present embodiment exists in the amorphous phase.

Figure 5:
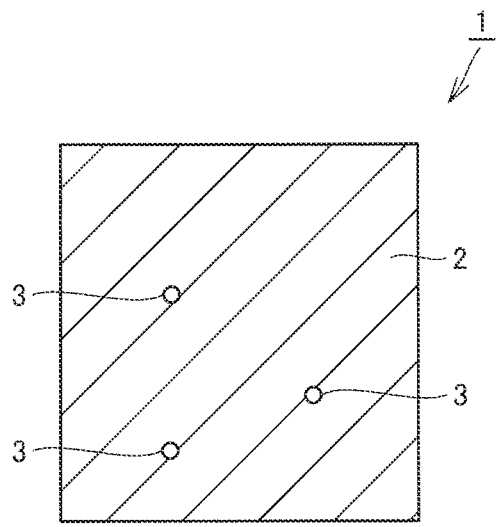
FIG. 5 is a schematic view showing a state of a structure of a thermoelectric conversion material in a second embodiment.

FIG. 5 is a schematic view showing a state of a structure of the thermoelectric conversion material in the second embodiment. With reference to FIG. 5, the structure of thermoelectric conversion material 1 includes amorphous phase 2 and crystal phases 3. As a main component, amorphous phase 2 contains SiGe serving as the base material element. Here, the content ratio of SiGe contained as the main component is, for example, more than or equal to 50 mass %, is preferably more than or equal to 90 mass %, and is more preferably more than or equal to 95%. Each of crystal phases 3 is a microcrystal composed of SiGe serving as the base material element. Crystal phase 3 exists in amorphous phase 2. In the present embodiment, the plurality of granular crystal phases 3 exist in amorphous phase 2 in a dispersed manner. A grain size of each crystal phase 3 is less than or equal to 50 nm. The grain size of crystal phase 3 can be calculated based on the full width at half maximum of a peak indicating SiGe in an X-ray diffraction pattern shown in FIG. 7 described later. It should be noted that the thermoelectric conversion material in the above-described first embodiment also has the same configuration. The same applies to below-described embodiments.

In thermoelectric conversion material 1, the structure of the thermoelectric conversion material includes amorphous phase 2 including the base material element as the main component, and crystal phase 3 of the base material element exists in amorphous phase 2. The thermoelectric conversion material including amorphous phase 2 can have a low thermal conductivity. Therefore, ZT can be increased. Moreover, since crystal phase 3 composed of the base material element exists in amorphous phase 2, the electric conductivity of thermoelectric conversion material 1 can be improved. Therefore, ZT can be increased. Therefore, the efficiency of thermoelectric conversion can be more improved. Moreover, since crystal phase 3 has a higher electric conductivity than that of amorphous phase 2, ZT is increased. On the other hand, when the grain size of the crystal phase becomes too large, the thermal conductivity tends to be high. With the grain size of crystal phase 3 composed of the base material element being less than or equal to 50 nm, the thermal conductivity can be suppressed from being increased. Therefore, according to such a thermoelectric conversion material 1, the thermal conductivity can be suppressed from being increased, while improving the electric conductivity. Therefore, the efficiency of thermoelectric conversion can be improved more by increasing ZT.

Figure 6:
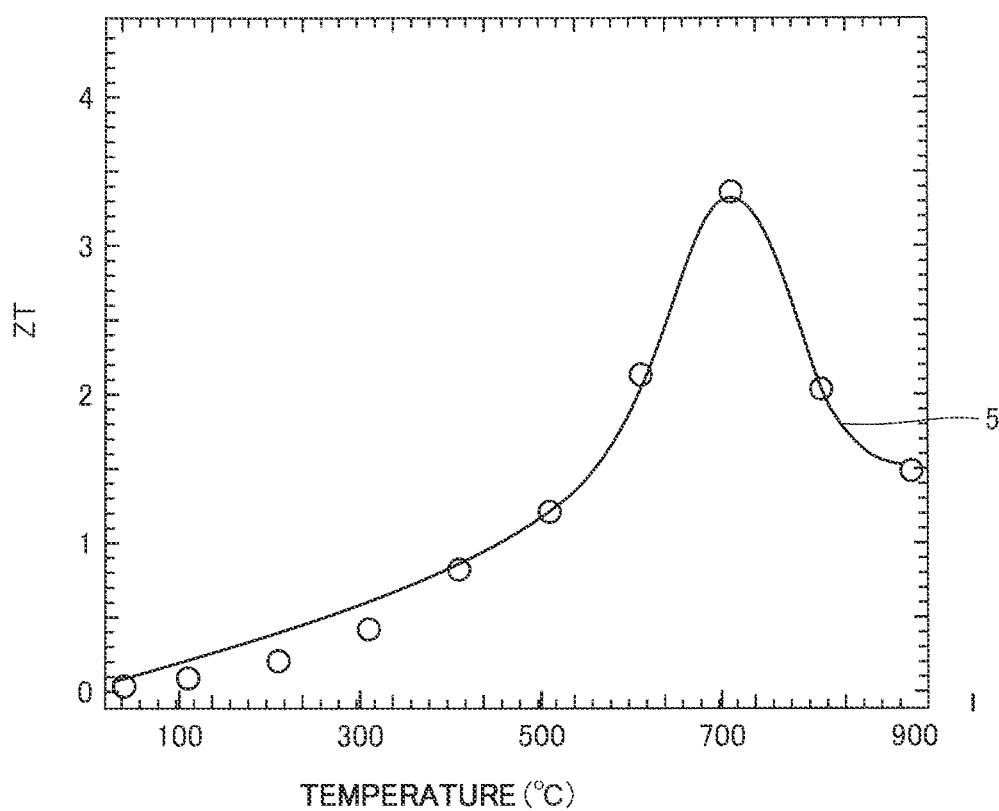
FIG. 6 is a graph showing a relation between a temperature and ZT of the thermoelectric conversion material in the second embodiment.

A relation between the temperature and ZT in the obtained thermoelectric conversion material was determined. FIG. 6 is a graph showing the relation between the temperature and ZT of the thermoelectric conversion material in the second embodiment. In FIG. 6, the horizontal axis represents the temperature (° C.) and the vertical axis represents ZT. An eye guide for plot of the graph is represented by a line 5 in FIG. 6. FIG. 6 shows a case of the thermoelectric conversion material in the second embodiment for which mechanical alloying has been performed for 10 hours. Each of the values of ZT in FIG. 6 was determined from a result of measuring resistivity, Seebeck coefficient, and thermal conductivity of the thermoelectric conversion material in vacuum. Moreover, FIG. 6 shows a result in the case where the measurement is performed when heating from a low temperature to a high temperature.

With reference to FIG. 6, as the temperature is increased from a room temperature to 700° C., the value of ZT is larger. At 700° C., ZT has a very high value of more than or equal to 3. As 700° C. is exceeded, ZT is decreased gradually. Therefore, for example, when used in a range of not more than 700° C. or when used at about 700° C., thermoelectric conversion can be performed with a high value of ZT, whereby the efficiency of thermoelectric conversion can be more improved.

Figure 7:
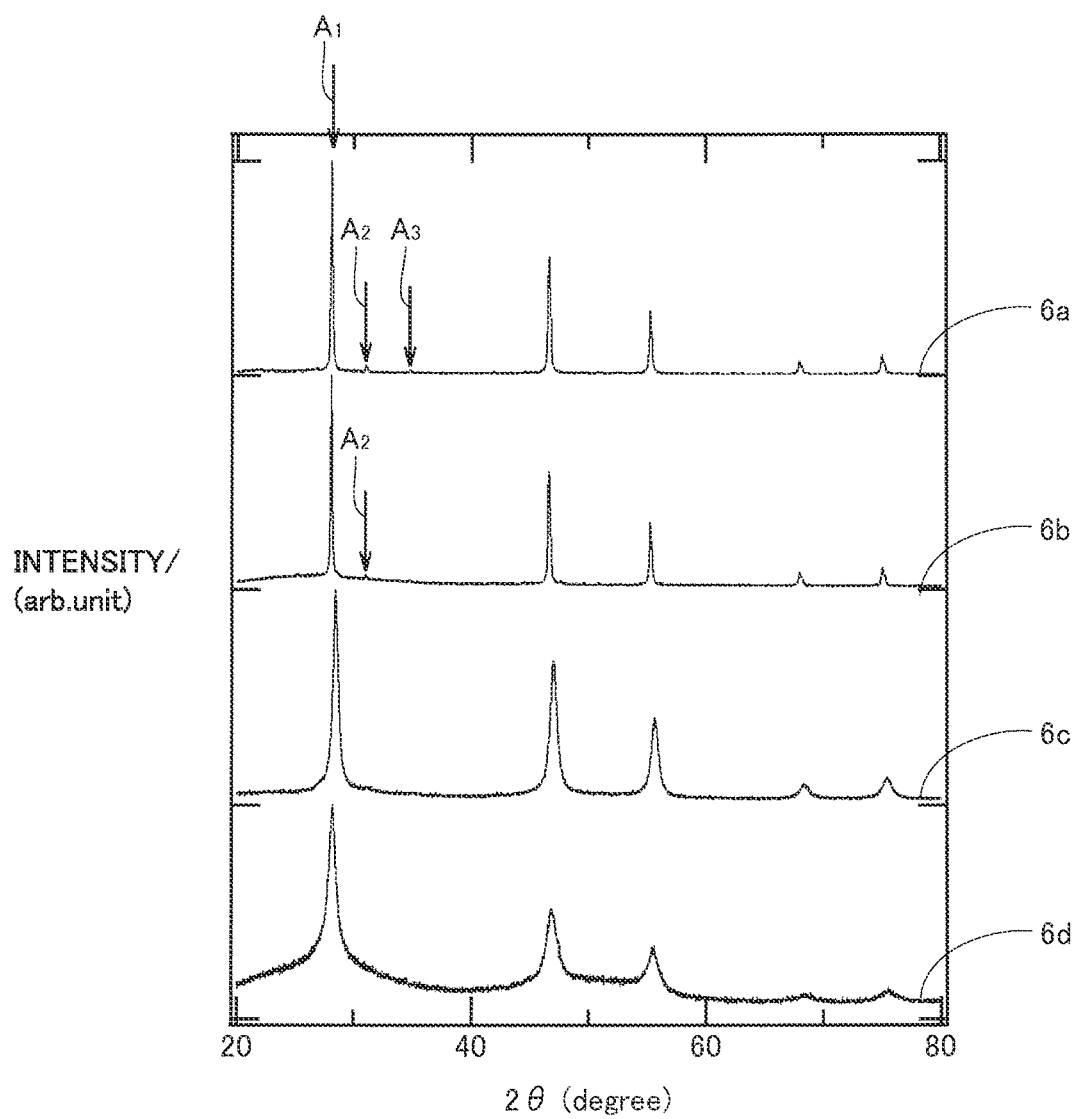
FIG. 7 shows X-ray diffraction patterns of the thermoelectric conversion material in the second embodiment.

FIG. 7 shows an X-ray diffraction pattern of a thermoelectric conversion material in the second embodiment. In FIG. 7, each of an X-ray diffraction pattern 6a and an X-ray diffraction pattern 6b represents a case where the measurement is performed at 900° C. X-ray diffraction pattern 6a represents a sample in which the thermal conductivity is measured, and X-ray diffraction pattern 6b represents a sample in which resistivity is measured. An X-ray diffraction pattern 6c represents a case where sintering is performed at 600° C. A line 6d represents an X-ray diffraction pattern when no spark plasma sintering is performed.

It should be noted that for the measurement of the X-ray diffraction patterns, D8 Advance provided by Bruker was used as an X-ray diffractometer. CuKα rays were used as an X-ray source, and a θ-2θ method (Bragg-Brentano type diverging/focusing system) was used as a measurement method. It should be noted that a below-described Rietveld analysis was performed using PROGRAM FullProf.2k.

With reference to FIG. 7, a peak $A_1$ is a peak corresponding to the crystal phase of SiGe. In the case of X-ray diffraction pattern 6a measured at 900° C., a peak indicating the crystal phase of SiGe, which is a crystal phase composed of the base material element, appears. From the full width at half maximum of the peak of the crystal phase composed of SiGe represented by X-ray diffraction pattern 6a, the grain size of the crystal phase composed of SiGe is determined to be 50 nm. Peak $A_1$ is a peak having a maximum intensity in peaks each indicating the crystal phase of SiGe.

Moreover, a peak $A_2$ is a peak corresponding to the crystal phase of Fe. In X-ray diffraction pattern 6a, a peak indicating the crystal phase of Fe, which is a crystal phase including the first additional element, appears. This peak $A_2$ is a peak having the maximum intensity in peaks each indicating the crystal phase of Fe. A ratio of the intensity of the peak having the maximum intensity in the peaks each indicating the crystal phase of Fe to the intensity of the peak having the maximum intensity in the peaks each indicating the crystal phase composed of SiGe is 1.6%. That is, the ratio of the intensity of the peak having the maximum intensity in the peaks each indicating the crystal phase of Fe to the intensity of the peak having the maximum intensity in the peaks each indicating the crystal phase composed of SiGe is less than or equal to 2.0%.

Moreover, a peak $A_3$ is a peak indicating a crystal phase of $P_4Si_4$. In X-ray diffraction pattern 6a, a peak indicating the crystal phase of $P_4Si_4$, which is a crystal phase including the second additional element, appears. This peak $A_3$ is a peak having the maximum intensity in peaks each indicating the crystal phase of $P_4Si_4$. A ratio of the intensity of the peak having the maximum intensity in the peaks each indicating the crystal phase of $P_4Si_4$ to the intensity of the peak having the maximum intensity in the peaks each indicating the crystal phase composed of SiGe is also 1.6%. That is, the ratio of the intensity of the peak having the maximum intensity in the peaks each indicating the crystal phase of $P_4Si_4$ to the intensity of the peak having the maximum intensity in the peaks each indicating the crystal phase composed of SiGe is less than or equal to 2.0%.

In the case of X-ray diffraction pattern 6b measured at 900° C., a peak indicating the crystal phase of SiGe, which is a crystal phase composed of the base material element, appears. From the full width at half maximum of the peak of the crystal phase composed of SiGe represented by X-ray diffraction pattern 6b, the grain size of the crystal phase composed of SiGe is determined to be 50 nm. Peak $A_1$ is a peak having a maximum intensity in peaks each indicating the crystal phase composed of SiGe. In X-ray diffraction pattern 6b, a peak indicating the crystal phase of Fe, which is a crystal phase including the first additional element, appears. This peak $A_2$ is a peak having the maximum intensity in peaks each indicating the crystal phase of Fe. A ratio of the intensity of the peak having the maximum intensity in the peaks each indicating the crystal phase of Fe to the intensity of the peak having the maximum intensity in the peaks each indicating the crystal phase composed of SiGe is 1.6%. That is, the ratio of the intensity of the peak having the maximum intensity in the peaks each indicating the crystal phase of Fe to the intensity of the peak having the maximum intensity in the peaks each indicating the crystal phase composed of SiGe is less than or equal to 2.0%. It should be noted that in X-ray diffraction pattern 6b, no peak indicating the crystal phase of $P_4Si_4$ appears. That is, the ratio of the intensity of the peak having the maximum intensity in the peaks each indicating the crystal phase of $P_4Si_4$ to the intensity of the peak having the maximum intensity in the peaks each indicating the crystal phase composed of SiGe is less than or equal to 2.0%.

In the case of X-ray diffraction pattern 6c for which sintering is performed at 600° C., a peak indicating the crystal phase of SiGe, which is a crystal phase composed of the base material element, appears. From the full width at half maximum of the peak of the crystal phase composed of SiGe represented by X-ray diffraction pattern 6c, the grain size of the crystal phase composed of SiGe is determined to be 16 nm. It should be noted that in X-ray diffraction pattern 6c, no peak indicating the crystal phase of Fe appears and no peak indicating the crystal phase of $P_4Si_4$ appears. That is, the ratio of the intensity of the peak having the maximum intensity in the peaks each indicating the crystal phase of Fe to the intensity of the peak having the maximum intensity in the peaks each indicating the crystal phase composed of SiGe is less than or equal to 2.0%. Moreover, the ratio of the intensity of the peak having the maximum intensity in the peaks each indicating the crystal phase of $P_4Si_4$ to the intensity of the peak having the maximum intensity in the peaks each indicating the crystal phase composed of SiGe is less than or equal to 2.0%. That is, the ratio of the intensity of the peak having the maximum intensity in the peaks each indicating the crystal phase including at least one of the first additional element and the second additional element, to the intensity of the peak having the maximum intensity in the peaks each indicating the crystal phase composed of the base material element is less than or equal to 2.0%.

It should be noted that even in the case where no spark plasma sintering is performed as indicated by X-ray diffraction pattern 6d, a peak indicating the crystal phase composed of SiGe, which is a crystal phase composed of the base material element, appears. From the full width at half maximum of the peak of the crystal phase of SiGe represented by X-ray diffraction pattern 6d, the grain size of the crystal phase composed of SiGe is determined to be 10 nm. It should be noted that also in X-ray diffraction pattern 6d, no peak indicating the crystal phase of Fe appears and no peak indicating the crystal phase of $P_4Si_4$ appears.

The ratio of the intensity of the peak having the maximum intensity in the peaks indicating the crystal phase including at least one of Fe serving as the first additional element and P serving as the second additional element, to the intensity of the peak having the maximum intensity in the peaks each indicating the crystal phase composed of SiGe serving as the base material element is less than or equal to 2.0% in the X-ray diffraction pattern of the thermoelectric conversion material. When a multiplicity of crystal phases each including at least one of the first additional element and the second additional element are precipitated in the thermoelectric conversion material, a carrier concentration is decreased to result in deviation of the position of the Fermi level or the density of the first additional level is decreased as compared with the case where the number of crystal phases is small. Due to at least one or both of these factors, the effect of formation of the first additional level and the effect of formation of the second additional level are less likely to be obtained sufficiently. According to the above-described thermoelectric conversion material, since the amount of precipitation of the first additional element as the crystal phase and the amount of precipitation of the second additional element as the crystal phase are small, the effect of formation of the first additional level by the first additional element and the effect of formation of the second additional level by the second additional element can be obtained more securely. Therefore, the efficiency of thermoelectric conversion can be more improved.

Moreover, in the X-ray diffraction patterns shown in FIG. 7, when the measurement was performed at 900° C. as indicated by X-ray diffraction pattern 6a, the Rietveld analysis was performed to determine the ratio of the crystal phase including at least one of the first additional element and the second additional element. In this case, a ratio of the sum of the crystal phase of Fe, which is a crystal phase including the first additional element, and the crystal phase of $P_4Si_4$, which is a crystal phase including the second additional element, is determined. In the thermoelectric conversion material, the ratio of the crystal phase including at least one of the first additional element and the second additional element, i.e., in this case, the ratio of the sum of the crystal phase of Fe and the crystal phase of $P_4Si_4$, to the whole of the structure of the thermoelectric conversion material was less than or equal to 6.0 volume %, and was specifically 5.6 volume %. When sintering was performed at 600° C. as indicated by X-ray diffraction pattern 6c, the ratio of the crystal phase including at least one of the first additional element and the second additional element to the whole of the thermoelectric conversion material was 0 volume %. That is, the ratio of the crystal phase including at least one of the first additional element and the second additional element to the whole of the structure of the thermoelectric conversion material is less than or equal to 6.0 volume %.

With such a thermoelectric conversion material, since the amount of precipitation of the first additional element as the crystal phase and the amount of precipitation of the second additional element as the crystal phase are small, the effect of formation of the first additional level by the first additional element and the effect of formation of the second additional level by the second additional element can be obtained more securely. Therefore, the efficiency of thermoelectric conversion can be more improved.

In the above-described embodiment, the thermoelectric conversion material of the present application may include a first additional element having a vacant orbital in the f orbital located internal to the outermost shell. The same applies to below-described embodiments.

Third Embodiment

In a thermoelectric conversion material according to the present embodiment, the base material is a MnSi-based material, the first additional element is Re or W, and the second additional element is Cr or Fe. With the thermoelectric conversion material according to the second embodiment, the electric conductivity can be increased more securely. As a result, the efficiency of thermoelectric conversion can be improved by increasing ZT.

The thermoelectric conversion material according to the third embodiment may be manufactured using the following manufacturing method. First, a high-frequency heating furnace is used to melt and solidify a source material to produce a mother alloy. The source material is a mixture of Mn and Si each serving as the base material element, Re serving as the first additional element, and Cr serving as the second additional element. The produced mother alloy is melted and sprayed onto a rotating copper roll. By performing such a liquid quenching method in a non-equilibrium state, an amorphous alloy in the form of a ribbon (thin piece) is obtained. Heat treatment is performed onto the obtained amorphous alloy using the spark plasma sintering method, thereby obtaining a thermoelectric conversion material, which is a formed body in the form of a bulk. The thermoelectric conversion material according to the second embodiment may be obtained in this way.

Figure 8:
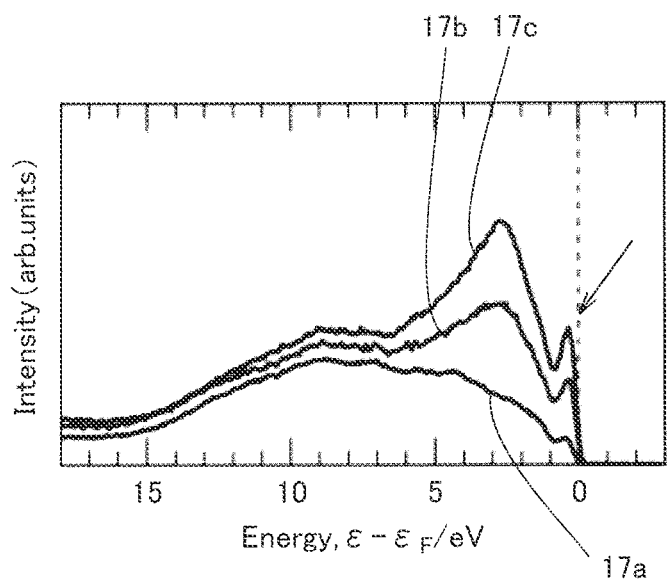
FIG. 8 is a graph showing a density of states when a content ratio of Re added to MnSi as the first additional element is changed.
Figure 9:
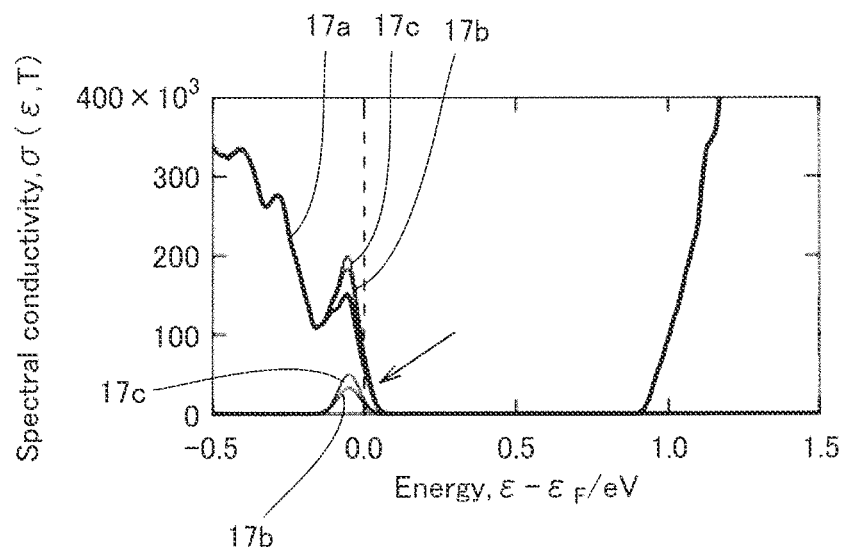
FIG. 9 is a graph showing a density of states when the content ratio of Re added to MnSi as the first additional element is changed.

Each of FIG. 8 and FIG. 9 is a graph showing a density of states when a content ratio of Re added to MnSi as the first additional element is changed. FIG. 8 shows a case where measurement is actually performed by way of HAXPES (Hard X-ray Photoelectron Spectroscopy), whereas FIG. 9 shows a case that is based on theoretical calculation. In each of FIG. 8 and FIG. 9, a line 17a represents a case where Re is not added, a line 17b represents a case where 4 at % of Re is added, and a line 17c represents a case where 6 at % of Re is added. In each of FIG. 8 and FIG. 9, the horizontal axis represents energy, and the vertical axis in FIG. 8 represents the intensity normalized with a value of 10 to 15 eV. The vertical axis in FIG. 9 represents spectral conductivity.

With reference to FIG. 8 and FIG. 9, it is understandable that the peak of the new level resulting from the addition of Re appears at the position of an end portion of the valence band adjacent to the forbidden band indicated by an arrow in each case. By adding Re, a steep first additional level with a small energy width can be formed.

Fourth Embodiment

In a thermoelectric conversion material according to the present embodiment, the base material is a SnSe-based material, the first additional element is Sc, Ti, or Zr, and the second additional element is F, Cl, Br, I, N, P, As, Sb, Bi, B, Al, Ga, or In. With the thermoelectric conversion material according to the third embodiment, the electric conductivity can be increased more securely. As a result, the efficiency of thermoelectric conversion can be improved by increasing ZT.

Figure 10:
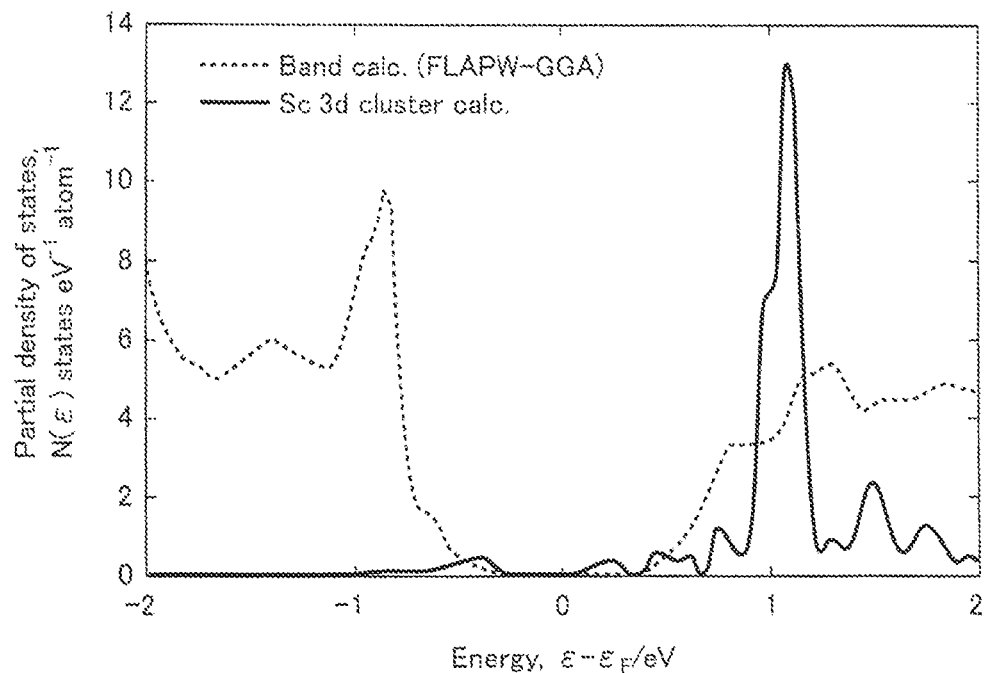
FIG. 10 shows an exemplary band structure in the case where the first additional level by Sc serving as the first additional element exists in a SnSe-based material.
Figure 11:
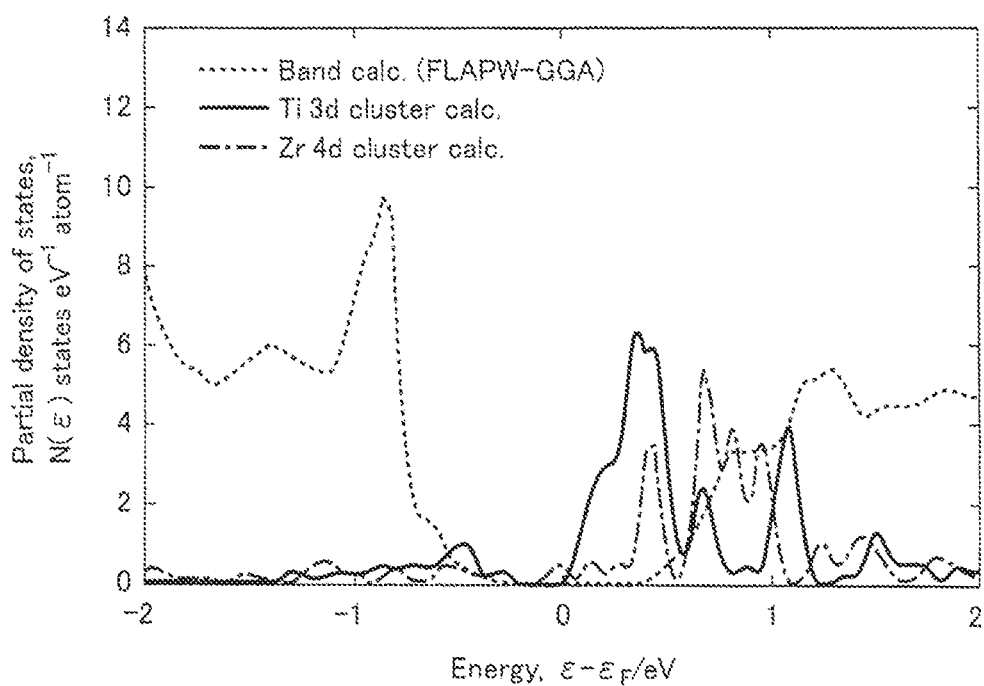
FIG. 11 shows an exemplary band structure in the case where the first additional level by Ti or Zr each serving as the first additional element exists in the SnSe-based material.

FIG. 10 shows an exemplary band structure in the case where the first additional level by Sc serving as the first additional element exists in the SnSe-based material. In FIG. 10, the band of SnSe is calculated by an FLAPW (Full-potential Linearized Augmented Plane Wave) method. An exchange interaction thereof is handled within the framework of a GGA (Generalized Gradient Approximation) method. The band of the 3d orbital of Sc is determined by cluster calculation (which refers to calculation employing a cluster model). FIG. 11 shows an exemplary band structure in the case where the first additional level by Ti or Zr each serving as the first additional element exists in the SnSe-based material. The FLAPW method and the GGA method are used also in FIG. 11. Moreover, the band of the 3d orbital of Ti and the band of the 4d orbital of Zr are also determined by cluster calculation.

With reference to FIG. 10 and FIG. 11, Sc, Ti, or Zr each serving as the first additional element can form a steep first additional level with a small energy width in the vicinity of the end portion of the conduction band adjacent to the forbidden band of the band of SnSe.

Fifth Embodiment

In a thermoelectric conversion material according to the present embodiment, the base material is a $Cu_2Se$-based material, the first additional element is V, Sc, Ti, Co, or Ni, and the second additional element is F, Cl, Br, I, N, P, As, Sb, Bi, Mg, Zn, or Cd. With the thermoelectric conversion material according to the fourth embodiment, the electric conductivity can be increased more securely. As a result, the efficiency of thermoelectric conversion can be improved by increasing ZT.

Figure 12:
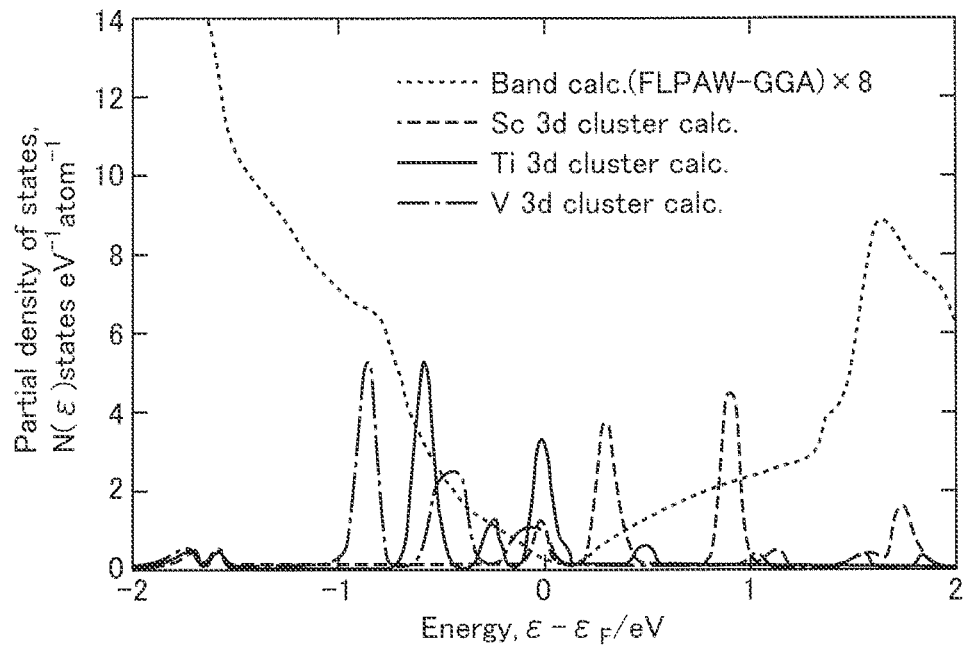
FIG. 12 shows an exemplary band structure in the case where the first additional level by Sc, Ti or V each serving as the first additional element exists in a $Cu_2Se$-based material.
Figure 13:
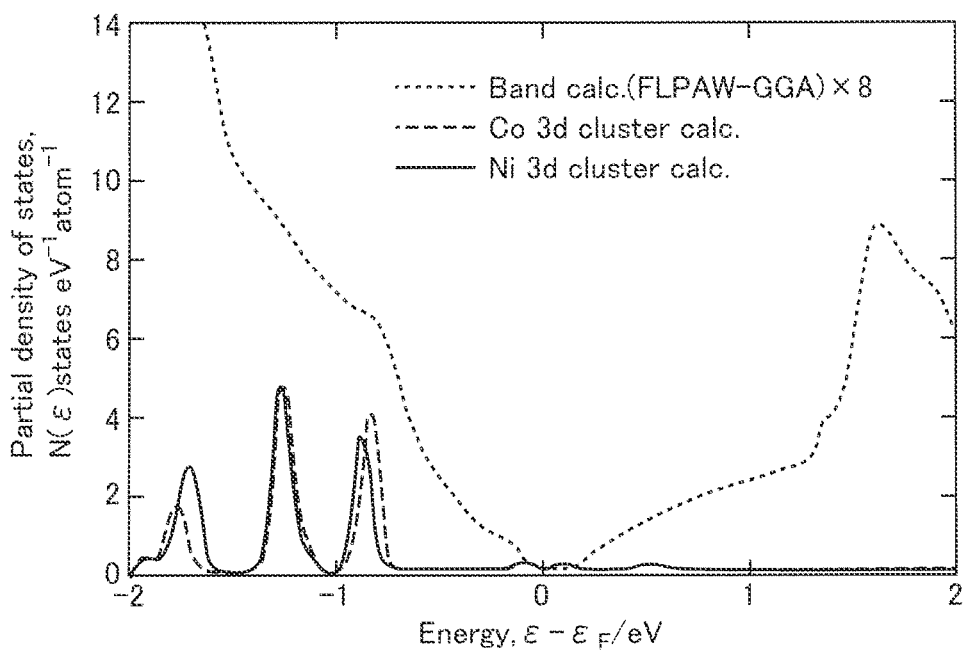
FIG. 13 shows an exemplary band structure in the case where the first additional level by Co or Ni each serving as the first additional element exists in the SnSe-based material.

FIG. 12 shows an exemplary band structure in the case where the first additional level by Sc, Ti or V each serving as the first additional element exists in the $Cu_2Se$-based material. Also in FIG. 12, the band of $Cu_2Se$ is calculated by the FLAPW method. Moreover, an exchange interaction thereof is also handled within the framework of the GGA method. Each of the band of the 3d orbital of Sc, the band of the 3d orbital of Ti, and the band of the 3d orbital of V is determined by cluster calculation. FIG. 13 shows an exemplary band structure in the case where the first additional level by Co or Ni each serving as the first additional element exists in the SnSe-based material. The FLAPW method and the GGA method are used also in FIG. 13. Each of the band of the 3d orbital of Co and the band of the 3d orbital of Ni is also determined by cluster calculation. In the presentations of FIG. 12 and FIG. 13, "×8" in notes indicates that a signal is amplified by 8 times.

With reference to FIG. 12 and FIG. 13, Sc, Ti, V, Co, or Ni each serving as the first additional element can form a steep band with a small energy width in the vicinity of the end portion of the conduction band or valence band adjacent to the forbidden band of the band of $Cu_2Se$.

Sixth Embodiment

Next, the following describes a power generation element as one embodiment of a thermoelectric conversion element using the thermoelectric conversion material according to the present application.

Figure 14:
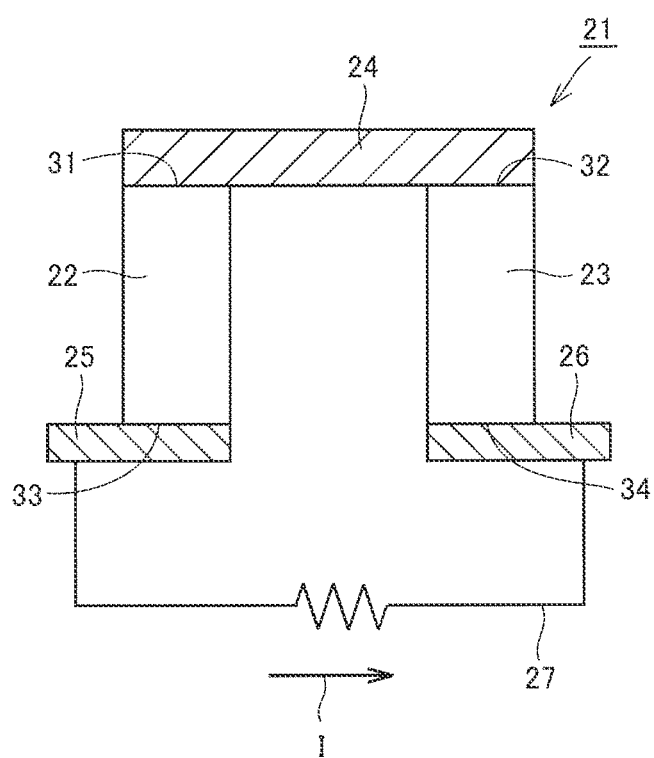
FIG. 14 is a schematic view showing a structure of a π type thermoelectric conversion element (power generation element), which is a thermoelectric conversion element in a sixth embodiment.

FIG. 14 is a schematic view showing a structure of a π type thermoelectric conversion element (power generation element) 21 serving as a thermoelectric conversion element in the present embodiment. With reference to FIG. 14, π type thermoelectric conversion element 21 includes: a p type thermoelectric conversion material portion 22 serving as a first thermoelectric conversion material portion; an n type thermoelectric conversion material portion 23 serving as a second thermoelectric conversion material portion; a high temperature side electrode 24; a first low temperature side electrode 25; a second low temperature side electrode 26; and a wiring 27.

P type thermoelectric conversion material portion 22 is composed of the thermoelectric conversion material of the first embodiment adjusted in component composition to have p type conductivity, for example. The thermoelectric conversion material of the first embodiment that constitutes p type thermoelectric conversion material portion 22 is doped with a p type impurity to generate, for example, p type carriers (positive holes), which are majority carriers, with the result that p type thermoelectric conversion material portion 22 has p type conductivity.

N type thermoelectric conversion material portion 23 is composed of the thermoelectric conversion material of the first embodiment adjusted in component composition to have n type conductivity, for example. The thermoelectric conversion material of the first embodiment that constitutes n type thermoelectric conversion material portion 23 is doped with an n type impurity to generate, for example, n type carriers (electrons), which are majority carriers, with the result that n type thermoelectric conversion material portion 23 has n type conductivity.

P type thermoelectric conversion material portion 22 and n type thermoelectric conversion material portion 23 are disposed side by side with a space being interposed therebetween. High temperature side electrode 24 is disposed to extend from one end portion 31 of p type thermoelectric conversion material portion 22 to one end portion 32 of n type thermoelectric conversion material portion 23. High temperature side electrode 24 is disposed in contact with both one end portion 31 of p type thermoelectric conversion material portion 22 and one end portion 32 of n type thermoelectric conversion material portion 23. High temperature side electrode 24 is disposed to connect one end portion 31 of p type thermoelectric conversion material portion 22 to one end portion 32 of n type thermoelectric conversion material portion 23. High temperature side electrode 24 is composed of an electrically conductive material such as a metal. High temperature side electrode 24 makes ohmic contact with p type thermoelectric conversion material portion 22 and n type thermoelectric conversion material portion 23.

First low temperature side electrode 25 is disposed in contact with the other end portion 33 of p type thermoelectric conversion material portion 22. First low temperature side electrode 25 is disposed to be separated from high temperature side electrode 24. First low temperature side electrode 25 is composed of an electrically conductive material such as a metal. First low temperature side electrode 25 makes ohmic contact with p type thermoelectric conversion material portion 22.

Second low temperature side electrode 26 is disposed in contact with the other end portion 34 of n type thermoelectric conversion material portion 23. Second low temperature side electrode 26 is disposed to be separated from high temperature side electrode 24 and first low temperature side electrode 25. Second low temperature side electrode 26 is composed of an electrically conductive material such as a metal.

Second low temperature side electrode 26 makes ohmic contact with n type thermoelectric conversion material portion 23.

Wiring 27 is composed of an electrical conductor such as a metal. Wiring 27 electrically connects first low temperature side electrode 25 to second low temperature side electrode 26.

For example, when a temperature difference is formed in it type thermoelectric conversion element 21 to attain a high temperature on the side of each of one end portion 31 of p type thermoelectric conversion material portion 22 and one end portion 32 of n type thermoelectric conversion material portion 23 and to attain a low temperature on the side of each of the other end portion 33 of p type thermoelectric conversion material portion 22 and the other end portion 34 of n type thermoelectric conversion material portion 23, p type carriers (positive holes) are moved from one end portion 31 side toward the other end portion 33 side in p type thermoelectric conversion material portion 22. On this occasion, in n type thermoelectric conversion material portion 23, n type carriers (electrons) are moved from the one end portion 32 side toward the other end portion 34 side. As a result, current flows in wiring 27 in a direction of arrow I. In this way, power generation by thermoelectric conversion using the temperature difference is attained in it type thermoelectric conversion element 21. That is, it type thermoelectric conversion element 21 is a power generation element.

As a material for each of p type thermoelectric conversion material portion 22 and n type thermoelectric conversion material portion 23, the thermoelectric conversion material of the first embodiment having an increased value of ZT is employed, for example. As a result, it type thermoelectric conversion element 21 is a highly efficient power generation element.

In the above-described embodiment, the it type thermoelectric conversion element has been illustrated as one example of the thermoelectric conversion element of the present application; however, the thermoelectric conversion element of the present application is not limited to this. The thermoelectric conversion element of the present application may be a thermoelectric conversion element having a different structure, such as an I type (uni-leg type) thermoelectric conversion element, for example.

Seventh Embodiment

By electrically connecting a plurality of π type thermoelectric conversion elements 21, a power generation module serving as a thermoelectric conversion module can be obtained. A power generation module 41 serving as a thermoelectric conversion module of the present embodiment has a structure in which a plurality of π type thermoelectric conversion elements 21 are connected in series.

Figure 15:
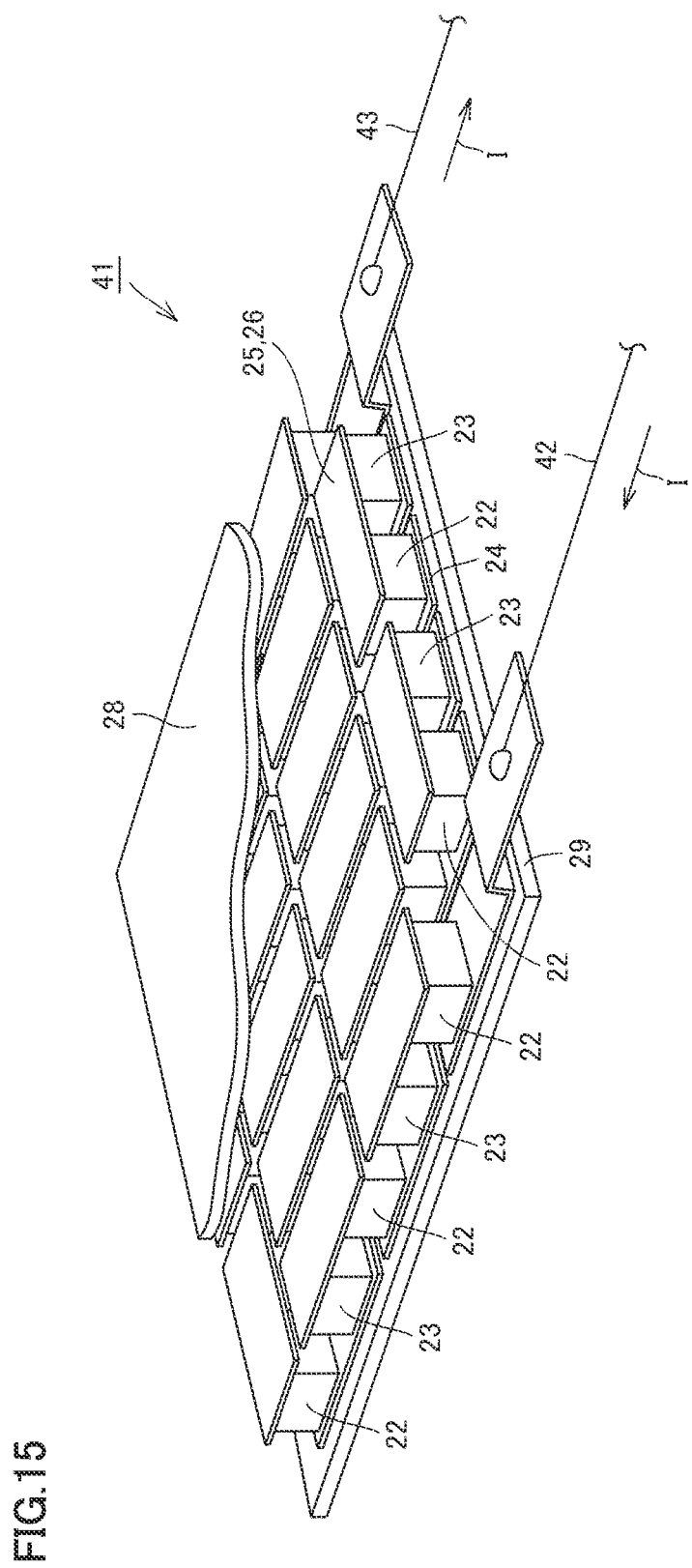
FIG. 15 shows an exemplary structure of a power generation module.

FIG. 15 shows an exemplary structure of the power generation module. With reference to FIG. 15, power generation module 41 of the present embodiment includes: p type thermoelectric material portions 22; n type thermoelectric material portions 23; low temperature side electrodes 25, 26 corresponding to first low temperature side electrodes 25 and second low temperature side electrodes 26; high temperature side electrodes 24; a low temperature side insulator substrate 28; and a high temperature side insulator substrate 29. Each of low temperature side insulator substrate 28 and high temperature side insulator substrate 29 is composed of a ceramic such as alumina. P type thermoelectric conversion material portions 22 and n type thermoelectric conversion material portions 23 are disposed side by side alternately. As with π type thermoelectric conversion element 21 described above, low temperature side electrodes 25, 26 are disposed in contact with p type thermoelectric conversion material portions 22 and n type thermoelectric conversion material portions 23. As with it type thermoelectric conversion element 21 described above, high temperature side electrodes 24 are disposed in contact with p type thermoelectric conversion material portions 22 and n type thermoelectric conversion material portions 23. Each p type thermoelectric conversion material portion 22 is connected to an adjacent n type thermoelectric conversion material portion 23 on one side by a common high temperature side electrode 24. Moreover, each p type thermoelectric material portion 22 is connected to an adjacent n type thermoelectric material portion 23 on a side different from the one side by common low temperature side electrodes 25, 26. In this way, all the p type thermoelectric conversion material portions 22 and n type thermoelectric conversion material portions 23 are connected in series.

Low temperature side insulator substrate 28 is disposed on a main surface side of each of low temperature side electrodes 25, 26 that are each in the form of a plate, the main surface side being opposite to a side thereof in contact with p type thermoelectric conversion material portions 22 and n type thermoelectric conversion material portions 23. One low temperature side insulator substrate 28 is disposed for the plurality of (all the) low temperature side electrodes 25, 26. High temperature side insulator substrate 29 is disposed on a side of high temperature side electrodes 24 that are each in the form of a plate, the side being opposite to a side thereof in contact with p type thermoelectric conversion material portions 22 and n type thermoelectric conversion material portions 23. One high temperature side insulator substrate 29 is disposed for the plurality of (all the) high temperature side electrodes 24.

Wirings 27 are connected to high temperature side electrodes 24 or low temperature side electrodes 25, 26 in contact with p type thermoelectric conversion material portions 22 or n type thermoelectric conversion material portions 23 located at both ends among p type thermoelectric conversion material portions 22 and n type thermoelectric conversion material portions 23 connected in series. When a temperature difference is formed to attain a high temperature on the high temperature side insulator substrate 29 side and a low temperature on the low temperature side insulator substrate 28 side, current flows in a direction of arrow I by p type thermoelectric material portions 22 and n type thermoelectric material portions 23 connected in series, as with π type thermoelectric material element 21 described above.

In this way, power generation by thermoelectric conversion using the temperature difference is attained in power generation module 41.

Eighth Embodiment

Next, an infrared sensor, which is an optical sensor, will be described as another embodiment of the thermoelectric conversion element using the thermoelectric conversion material according to the present application.

Figure 16:
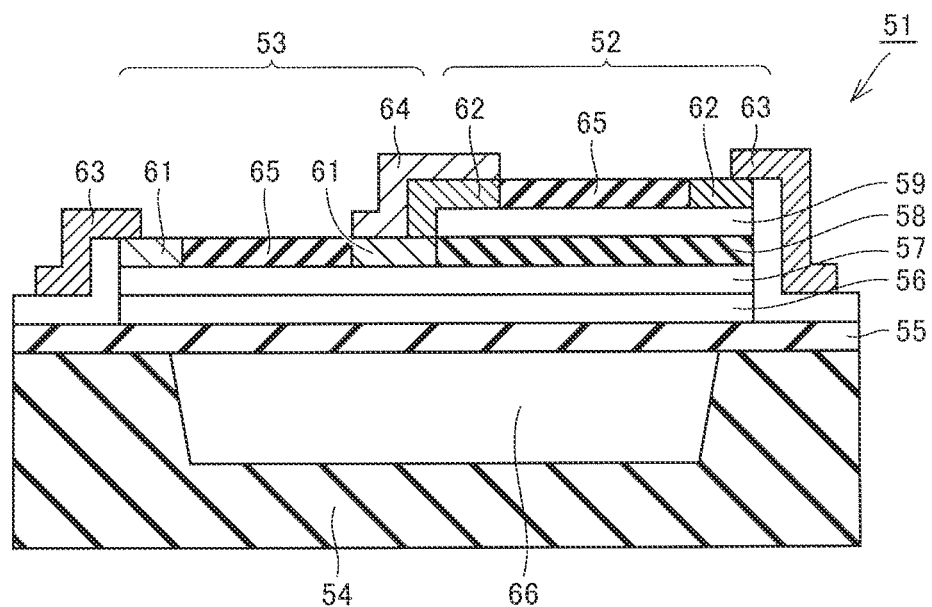
FIG. 16 shows an exemplary structure of an infrared sensor.

FIG. 16 shows an exemplary structure of an infrared sensor 51. With reference to FIG. 16, infrared sensor 51 includes a p type thermoelectric conversion material portion 52 and an n type thermoelectric conversion material portion 53 disposed adjacent to each other. P type thermoelectric conversion material portion 52 and n type thermoelectric conversion material portion 53 are formed on a substrate 54.

Infrared sensor 51 includes substrate 54, an etching stop layer 55, an n type thermoelectric conversion material layer 56, an $n^+$ type ohmic contact layer 57, an insulator layer 58, a p type thermoelectric conversion material layer 59, an n side ohmic contact electrode 61, a p side ohmic contact electrode 62, a heat absorption pad 63, an absorber 64, and a protective film 65.

Substrate 54 is composed of an insulator such as silicon dioxide. A recess 66 is formed in substrate 54. Etching stop layer 55 is formed to cover a surface of substrate 54. Etching stop layer 55 is composed of an insulator such as silicon nitride, for example. A clearance is formed between etching stop layer 55 and recess 66 of substrate 54.

N type thermoelectric conversion material layer 56 is formed on a main surface of etching stop layer 55 opposite to substrate 54. N type thermoelectric conversion material portion 56 is composed of the thermoelectric conversion material of the first embodiment adjusted in component composition to have n type conductivity, for example. The thermoelectric conversion material of the first embodiment that constitutes n type thermoelectric conversion material portion 56 is doped with a n type impurity to generate, for example, n type carriers (electrons), which are majority carriers, with the result that n type thermoelectric conversion material portion 56 has n type conductivity. $N^+$ type ohmic contact layer 57 is formed on a main surface of n type thermoelectric conversion material layer 56 opposite to etching stop layer 55. $N^+$ type ohmic contact layer 57 is doped with a higher concentration of an n type impurity than that in n type thermoelectric conversion material layer 56. The n type impurity generates n type carriers (electrons), which are majority carriers, for example. Accordingly, $n^+$ type ohmic contact layer 57 has n type conductivity.

N side ohmic contact electrode 61 is disposed in contact with a central portion of a main surface of $n^+$ type ohmic contact layer 57 opposite to n type thermoelectric conversion material layer 56. N side ohmic contact electrode 61 is composed of a material capable of ohmic contact with $n^+$ type ohmic contact layer 57, such as a metal. Insulator layer 58, which is composed of an insulator such as silicon dioxide, is disposed on a main surface of $n^+$ type ohmic contact layer 57 opposite to n type thermoelectric conversion material layer 56. When seen from n side ohmic contact electrode 61, insulator layer 58 is disposed on a main surface of n+ type ohmic contact layer 57 on the p type thermoelectric conversion material portion 52 side.

Protective film 65 is further disposed on the main surface of n+ type ohmic contact layer 57 opposite to n type thermoelectric conversion material layer 56. When seen from n side ohmic contact electrode 61, protective film 65 is disposed on the main surface of n+ type ohmic contact layer 57 opposite to p type thermoelectric conversion material portion 52. On the main surface of n+ type ohmic contact layer 57 opposite to n type thermoelectric conversion material layer 56, another n side ohmic contact electrode 61 is disposed on a side opposite to n side ohmic contact electrode 61 with protective film 65 being interposed therebetween.

P type thermoelectric conversion material layer 59 is disposed on the main surface of insulator layer 58 opposite to n+ type ohmic contact layer 57. P type thermoelectric conversion material layer 59 is composed of the thermoelectric conversion material of the first embodiment adjusted in component composition to have p type conductivity, for example. The thermoelectric conversion material of the first embodiment that constitutes p type thermoelectric conversion material layer 59 is doped with a p type impurity to generate, for example, p type carriers (positive holes), which are majority carriers, with the result that p type thermoelectric conversion material layer 59 has p type conductivity.

Protective film 65 is disposed at a central portion on the main surface of p type thermoelectric conversion material layer 59 opposite to insulator layer 58. On the main surface of p type thermoelectric conversion material layer 59 opposite to insulator layer 58, a pair of p side ohmic contact electrodes 62 are disposed with protective film 65 being interposed therebetween. P side ohmic contact electrode 62 is composed of a material capable of ohmic contact with p type thermoelectric conversion material layer 59, such as a metal. Of the pair of p side ohmic contact electrodes 62, p side ohmic contact electrode 62 on the n type thermoelectric conversion material portion 53 side is connected to n side ohmic contact electrode 61.

An absorber 64 is disposed to cover each of main surfaces of p side ohmic contact electrode 62 and n side ohmic contact electrode 61 opposite to n+ type ohmic contact layer 57. P side ohmic contact electrode 62 and n side ohmic contact electrode 61 are connected to each other. Absorber 64 is composed of titanium, for example. A heat absorption pad 63 is disposed on and in contact with p side ohmic contact electrode 62 on the side not connected to n side ohmic contact electrode 61. Moreover, a heat absorption pad 63 is disposed on and in contact with n side ohmic contact electrode 61 on the side not connected to p side ohmic contact electrode 62. Examples of a material for each heat absorption pad 63 include Au (gold)/Ti (titanium).

When infrared sensor 51 is irradiated with infrared rays, absorber 64 absorbs energy of the infrared rays. As a result, the temperature of absorber 64 is increased. On the other hand, the temperature of heat absorption pad 63 is suppressed from being increased. Accordingly, a temperature difference is formed between absorber 64 and heat absorption pad 63. Accordingly, in p type thermoelectric conversion material layer 59, p type carriers (positive holes) are moved from the absorber 64 side toward the heat absorption pad 63 side. On the other hand, in n type thermoelectric conversion material layer 56, n type carriers (electrons) are moved from the absorber 64 side toward the heat absorption pad 63 side. Then, by extracting current resulting from the movement of the carries from n side ohmic contact electrode 61 and p side ohmic contact electrode 62, the infrared rays are detected.

In infrared sensor 51 of the present embodiment, as the material for each of p type thermoelectric conversion material layer 59 and n type thermoelectric conversion material layer 56, the thermoelectric conversion material of the first embodiment is employed in which the value of ZT is increased by attaining a sufficiently high value of electric conductivity. As a result, infrared sensor 51 is a high-sensitivity infrared sensor.

In the above-described thermoelectric conversion material, each of the SiGe-based material, MnSi-based material, SnSe-based material, and $Cu_2Se$-based material is employed for the base material that is a semiconductor; however, the base material is not limited thereto. A different semiconductor may be used as the base material. It should be noted that when the base material is formed using, for example, a Group III-V element as the base material element, a difference may be 1 between the number of electrons in the outermost shell of the second additional element and the number of electrons in at least one outermost shell of the base material element. Also in this way, the efficiency of thermoelectric conversion can be improved.

In the above-described thermoelectric conversion material, the ratio of the density of states of the first additional level may be less than 0.1 with respect to the maximum value of the density of states of the valence band adjacent to the forbidden band of the base material.

In the above-described thermoelectric conversion material, an element other than a transition metal may be employed as the first additional element.

In the above-described embodiment, the second additional element is preferably formed in a region within 0.1 eV from the valence band or conduction band of the base material. In this way, even when the concentration of the second additional element is low, the carrier concentration can be increased, thereby facilitating to move the Fermi level effectively.

It should be understood that the embodiments disclosed herein are illustrative and non-restrictive in any respect. The scope of the present disclosure is defined by the terms of the claims, rather than the embodiments described above, and is intended to include any modifications within the scope and meaning equivalent to the terms of the claims.

REFERENCE SIGNS LIST

1: thermoelectric conversion material; 2: crystal phase; 3: amorphous phase; 5, 6a, 6b, 6c, 6d: X-ray diffraction pattern; 10: second additional element; 11: valence band; 12: conduction band; 13: forbidden band; 14, 15, 16: additional level; 17a, 17b, 17c: line; 21: π type thermoelectric conversion element; 22, 52: p type thermoelectric conversion material portion; 23, 53: n type thermoelectric conversion material portion; 24: high temperature side electrode; 25: first low temperature side electrode (low temperature side electrode); 26: second low temperature side electrode (low temperature side electrode); 27, 42, 43: wiring; 28: low temperature side insulator substrate; 29: high temperature side insulator substrate; 31, 32, 33, 34: end portion; 41: thermoelectric conversion module; 46a, 46b: region; 47: energy level; 51: infrared sensor; 54: substrate; 55: etching stop layer; 56: n type thermoelectric conversion material layer; 57: n+ type ohmic contact layer; 58: insulator layer; 59: p type thermoelectric conversion material layer; 61: n side ohmic contact electrode; 62: p side ohmic contact electrode; 63: heat absorption pad; 64: absorber; 65: protective film; 66: recess

The invention claimed is:

1. A thermoelectric conversion material comprising:
a base material that is a semiconductor composed of a base material element;
a first additional element, the first additional element being an element different from the base material element, the first additional element having a vacant orbital in a d orbital or f orbital located internal to an outermost shell of the first additional element, the first additional element forming a first additional level in a forbidden band of the base material; and
a second additional element, the second additional element being an element different from both of the base material element and the first additional element, the second additional element forming a second additional level in the forbidden band of the base material, wherein
a difference is 1 between the number of electrons in an outermost shell of the second additional element and the number of electrons in at least one outermost shell of the base material element,
wherein a structure of the thermoelectric conversion material comprises a crystal phase of the base material, a crystal phase including the first additional element and a crystal phase including the second additional element,
wherein a ratio of a crystal phase including at least one of the first additional element and the second additional element to a whole of the structure of the thermoelectric conversion material is less than or equal to 6.0 volume %,
wherein the base material is a SiGe-based material,
wherein a ratio of an energy difference between a valence band of the base material and the first additional level at a position closest to the valence band of the base material to a band gap of the base material is more than or equal to 20%,
wherein a ratio of an energy difference between a conduction band of the base material and the first additional level at a position closest to the conduction band of the base material to the band gap of the base material is more than or equal to 20%, and
wherein the first additional element is Fe, Cu, Ni, Mn, Cr, V, Ti, Ag, Pd, Pt, or Ir.

2. The thermoelectric conversion material according to claim 1, wherein a crystal phase having a grain size of less than or equal to 50 nm and composed of the base material element is included in the structure of the thermoelectric conversion material.

3. The thermoelectric conversion material according to claim 2, wherein a ratio of an intensity of a peak having a maximum intensity in peaks each indicating a crystal phase including at least one of the first additional element and the second additional element, to an intensity of a peak having a maximum intensity in peaks each indicating a crystal phase composed of the base material element is less than or equal to 2.0% in an X-ray diffraction pattern of the thermoelectric conversion material.

4. The thermoelectric conversion material according to claim 2, wherein
the structure of the thermoelectric conversion material includes an amorphous phase including the base material element as a main component,
wherein a crystal phase composed of the base material element exists in the amorphous phase, and
wherein the crystal phase is a microcrystal which exists in the amorphous phase in a dispersed manner.

5. The thermoelectric conversion material according to claim 1, wherein the first additional element is a transition metal.

6. The thermoelectric conversion material according to claim 1, wherein the second additional level exists between the first additional level and an energy band that is one of a valence band and a conduction band each adjacent to the forbidden band of the base material, the one of the valence band and the conduction band being close to the first additional level relative to the other of the valence band and the conduction band.

7. The thermoelectric conversion material according to claim 1, wherein a density of states of the first additional level has a ratio of more than or equal to 0.1 with respect to a maximum value of a density of states in a valence band adjacent to the forbidden band of the base material.

8. The thermoelectric conversion material according to claim 1, wherein a content ratio of the first additional element is more than or equal to 0.1 at % and less than or equal to 5 at %.

9. The thermoelectric conversion material according to claim 1, wherein
the first additional element is Cu, and
the second additional element is B.

10. A thermoelectric conversion material comprising,
a base material that is a semiconductor composed of a base material element;
a first additional element, the first additional element being an element different from the base material element, the first additional element having a vacant orbital in a d orbital or f orbital located internal to an outermost shell of the first additional element, the first additional element forming a first additional level in a forbidden band of the base material; and
a second additional element, the second additional element being an element different from both of the base material element and the first additional element, the second additional element forming a second additional level in the forbidden band of the base material, wherein
a difference is 1 between the number of electrons in an outermost shell of the second additional element and the number of electrons in at least one outermost shell of the base material element,
wherein a structure of the thermoelectric conversion material comprises a crystal phase of the base material, a crystal phase including the first additional element and a crystal phase including the second additional element, and
wherein a ratio of a crystal phase including at least one of the first additional element and the second additional element to a whole of the structure of the thermoelectric conversion material is less than or equal to 6.0 volume %,
wherein
the first additional element is Fe, and
the second additional element is P.

11. A thermoelectric conversion element comprising:
a thermoelectric conversion material portion;
a first electrode disposed in contact with the thermoelectric conversion material portion; and a second electrode disposed in contact with the thermoelectric conversion material portion and disposed to be separated from the first electrode, wherein the thermoelectric conversion material portion is composed of the thermoelectric conversion material recited in claim 1, the thermoelectric conversion material being adjusted in component composition to have p type or n type conductivity.

12. A thermoelectric conversion module comprising a plurality of the thermoelectric conversion elements recited in claim 11.

13. An optical sensor comprising:

an absorber that absorbs optical energy; and a thermoelectric conversion material portion connected to the absorber, wherein the thermoelectric conversion material portion is composed of the thermoelectric conversion material recited in claim 1, the thermoelectric conversion material being adjusted in component composition to have p type or n type conductivity.

14. A thermoelectric conversion material comprising:

a base material that is a semiconductor composed of a base material element;

a first additional element, the first additional element being an element different from the base material element, the first additional element having a vacant orbital in a d orbital or f orbital located internal to an outermost shell of the first additional element, the first additional element forming a first additional level in a forbidden band of the base material; and a second additional element, the second additional element being an element different from both of the base material element and the first additional element, the second additional element forming a second additional level in the forbidden band of the base material, wherein a difference is 1 between the number of electrons in an outermost shell of the second additional element and the number of electrons in at least one outermost shell of the base material element, wherein a crystal phase having a grain size of less than or equal to 50 nm and composed of the base material element is included in a structure of the thermoelectric conversion material, wherein a ratio of an intensity of a peak having a maximum intensity in peaks each indicating a crystal phase including at least one of the first additional element and the second additional element, to an intensity of a peak having a maximum intensity in peaks each indicating a crystal phase composed of the base material element is less than or equal to 2.0% in an X-ray diffraction pattern of the thermoelectric conversion material, wherein the base material is a SiGe-based material, wherein a ratio of an energy difference between a valence band of the base material and the first additional level at a position closest to the valence band of the base material to a band gap of the base material is more than or equal to 20%, wherein a ratio of an energy difference between a conduction band of the base material and the first additional level at a position closest to the conduction band of the base material to the band gap of the base material is more than or equal to 20%, and wherein the first additional element is Fe, Cu, Ni, Mn, Cr, V, Ti, Ag, Pd, Pt, or Ir.

* * * * *